(12) United States Patent
Grube et al.

(10) Patent No.: US 7,239,159 B2
(45) Date of Patent: Jul. 3, 2007

(54) METHOD AND APPARATUS FOR VERIFYING PLANARITY IN A PROBING SYSTEM

(75) Inventors: Gary W. Grube, Pleasanton, CA (US); Thomas N. Watson, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/906,046

(22) Filed: Feb. 1, 2005

(65) Prior Publication Data

US 2006/0170434 A1   Aug. 3, 2006

(51) Int. Cl.
  *G01R 31/02* (2006.01)

(52) U.S. Cl. ...................................... 324/754

(58) Field of Classification Search .................. None
  See application file for complete search history.

(56) References Cited

U.S. PATENT DOCUMENTS 5,974,662 A * 11/1999 Eldridge et al. ............ 324/754

* cited by examiner

*Primary Examiner*—Jermele Hollington
(74) *Attorney, Agent, or Firm*—N. Kenneth Burraston

(57) ABSTRACT

An apparatus for determining a planarity of a first structure configured to hold a probing device to the planarity of a second structure configured to hold a device to be probed is disclosed. In one example of the apparatus, a plurality of moveable push rods are disposed in a substrate, which is attached to the first structure. In initial non-displaced positions, the push rods correspond to a planarity of the first structure. The second structure is then brought into contact with the push rods, displacing the push rods into second positions that correspond to a planarity of the second structure. In another example of the apparatus, beams of light are reflected off of reflectors disposed on the first structure and onto sensors disposed on the second structure. The locations of the reflected beams on the sensors are noted and used to determine the planarity of the first structure with respect to the second structure.

27 Claims, 14 Drawing Sheets

METHOD AND APPARATUS FOR VERIFYING PLANARITY IN A PROBING SYSTEM

BACKGROUND

FIG. 1 illustrates an exemplary wafer probing system 100 for testing the dies on a semiconductor wafer. In the exemplary system 100 shown in FIG. 1, a newly manufactured semiconductor wafer 124 comprising dies (not shown) to be tested is secured on a working surface 128 of a chuck 126 that is part of a moveable stage 112 inside a prober 109. The stage 112 moves the wafer 124 into contact with probes 122 of a probe card assembly 110. More specifically, bond pads (not shown) on the dies (not shown) of the wafer 124 are brought into contact with the probes 122, which establishes electrical connections between the dies (not shown) of the wafer 124 and the probes 122.

The tester 102 then generates test data patterns that are written into the dies (not shown), and the tester 102 evaluates response data generated by the dies to determine whether individual dies pass or fail the testing. The test data travels from the tester 102 through a communication link 104 to a test head 106. (Communications link 105 may also be provided for controlling the prober 109 as shown in FIG. 1.) From the test head 106, the test data travels through electrical connectors 108 (e.g., pogo pins) to the probe card assembly 110, which provides electrical connections to the probes 122. Response data generated by the dies (not shown) of wafer 124 travel in the reverse direction to the tester 102.

The probe card assembly 110 may be made and configured in any number of ways. The exemplary probe card assembly 110 shown in FIG. 1 includes a probe board 118 and a probe substrate 120, which are secured one to the other. The probe board 118 is attached by securing mechanism 116 (e.g., clamps or bolts) to a prober head plate 114. FIG. 2 illustrates a top view of a simplified prober head plate 114 that includes holes 202 for securing mechanism 116 and an opening 204 that allows electrical connectors 108 to contact probe board 118. Once the probe card assembly 110 is secured inside the prober 109, the stage 112 may move the wafer 124 into contact with the probes 122 as discussed above. U.S. Pat. No. 5,974,662 (which is incorporated herein by reference) discloses another exemplary probe card assembly.

It is often important that the prober head plate 114 and the working surface 128 of chuck 126 be planar with respect to each other within a specified tolerance. The specified tolerance typically depends on the particular probing application. If the prober head plate 114 and the working surface 128 of the chuck 126 are too far out of planarity, it may be difficult or impossible to properly connect electrically the dies (not shown) of wafer 124 with probes 122.

Typically, the test head 106 and the probe card assembly 110 must be removed from the prober 109 to planarize the prober head plate 114 with respect to the chuck surface 128. For example, probe card assembly 110 is unbolted and removed from the prober head plate 114, and the test head 106 is detached and removed from the prober 109. In some probers, the test head 106 may alternatively be loosened so that it is moveable yet still attached to the prober 109 and then tilted or otherwise moved out of its "test position" (i.e., the position of test head 106 during normal operation to test a semiconductor device or other electronic device disposed on the chuck 126), allowing access to the prober head plate 114 and chuck 126. With the probe card assembly 110 and test head 106 removed (or at least moved out of the way), workers manually measure distances between the prober head plate 114 and the surface 128 of the chuck 126 and adjust the planarity of the prober head plate 114 until the measurements indicate that the prober head plate 114 is planar with the chuck 126 (within an acceptable tolerance). Thereafter, the test head 106 is moved back into position and resecured to the prober 109, and the probe card assembly 110 is reattached to the prober head plate 114.

Not only is it time consuming and labor intensive to move and then replace the test head 106 and the probe card assembly 110, but the weight of the test head 106 (which often weighs about 200 pounds) may cause the prober 109 and/or the prober head plate 114 to shift or flex and thereby cause the prober head plate 114 to be out of planarity with the chuck 126 after the test head 106 is resecured to prober 106 in a test position. There is, therefore, a need for an improved method and apparatus for measuring the planarity of a prober head plate 114 with respect to a surface 128 of a chuck 126.

It should be noted that the wafer probing system 100 of FIG. 1 is but one example of a system in which a device is brought into contact with a plurality of probes in order to test, monitor, or operate the device. Other examples include systems for burning in semiconductor dies, systems for testing singulated dies (packaged or unpackaged), and systems for testing other electronic components, such as electronics modules. In many such systems, it is important that the planarity of an apparatus (e.g., the prober head plate 114) that holds a probing device (e.g., the probe card assembly 110) be within a specified tolerance of an apparatus (e.g., the chuck 126) that holds the device to be probed (e.g., the wafer 124). Therefore, the above described need for an improved method and apparatus for measuring planarity is generally applicable to any application in which the planarity of a first structure with respect to a second structure is measured, determined, and/or adjusted.

BRIEF SUMMARY

The present invention may be used to compare the planarity of a first structure to a second structure.

In an exemplary embodiment of the invention, a plurality of push rods disposed in a substrate are used to compare the planarity of a first structure configured to hold a probing device to the planarity of a second structure configured to hold a device to be probed. The substrate is attached to the first structure, and the push rods are reset to initial non-displaced positions, which correspond to a planarity of the first structure. The second structure is then brought into contact with the push rods, displacing the push rods into second positions that correspond to a planarity of the second structure. Differences in the displacements of the individual push rods indicate differences in the planarity of the first structure as compared to the second structure.

In another exemplary embodiment of the invention, beams of light are reflected off of reflectors disposed on the first structure and onto sensors disposed on the second structure. The locations of the reflected beams on the sensors are noted and used to determine the planarity of the first structure with respect to the second structure.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 3:
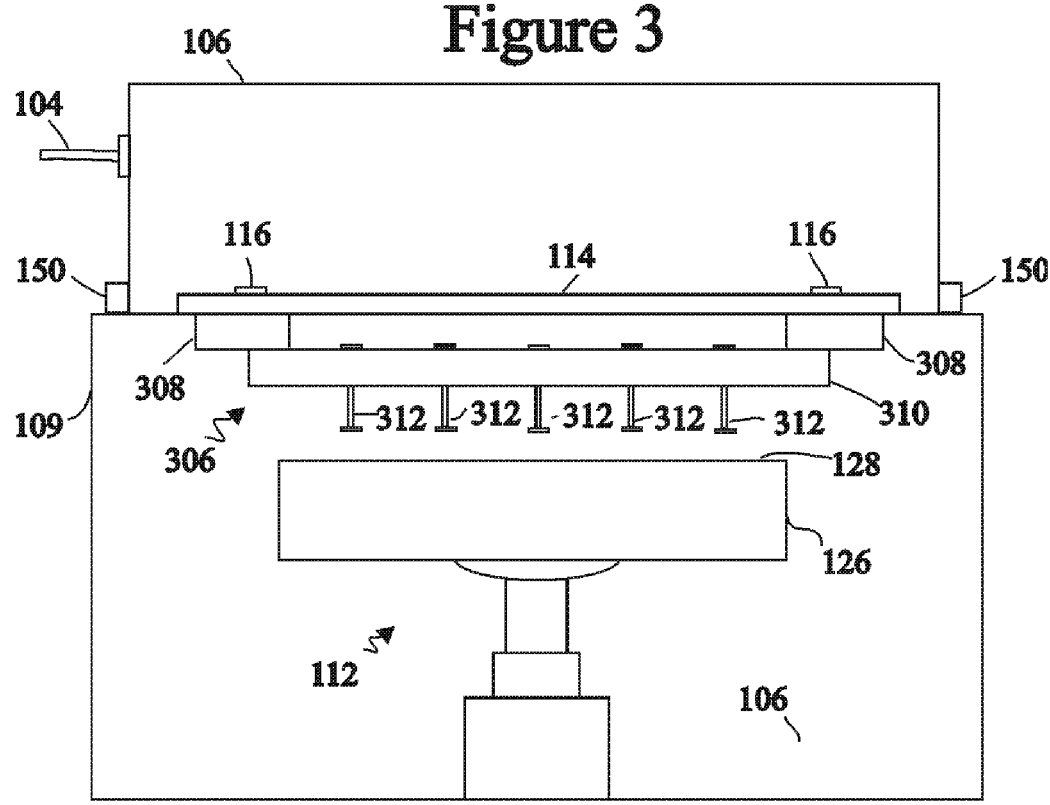
FIGS. 3 and 4 illustrate an exemplary planarity measuring apparatus disposed in an exemplary prober.

FIG. 3 depicts an exemplary embodiment of a planarity measuring apparatus 306 that may be used to take measurements relating to the orientation of the prober head plate 114 with respect to the working surface 128 of the chuck 126. As shown in FIG. 3, the planarity measuring apparatus 306 is secured to the prober head plate 114 by securing mechanisms 116 (e.g., clamps or bolts). The planarity measuring apparatus 306 shown in FIG. 3 includes a plurality of push rods 312 that are moveably disposed in a rod substrate 310, which is attached to a mounting board 308. Mounting board 308 may be secured to the prober head plate 114 by securing mechanisms 116 in the same manner in which a probe card assembly 110 would be secured to the prober head plate 114. Alternatively, rod substrate 310 may be secured directly to prober head plate 114, dispensing with the need for mounting board 308.

Rod substrate 310 and mounting board 308 may be any suitable substrate. For example, rod substrate 310 may be a ceramic substrate and mounting board 308 may comprise a printed circuit board material. Other materials that either the rod substrate 310 or the mounting board 308 may comprise include without limitation metal, rigid plastic, etc.

Figure 4:
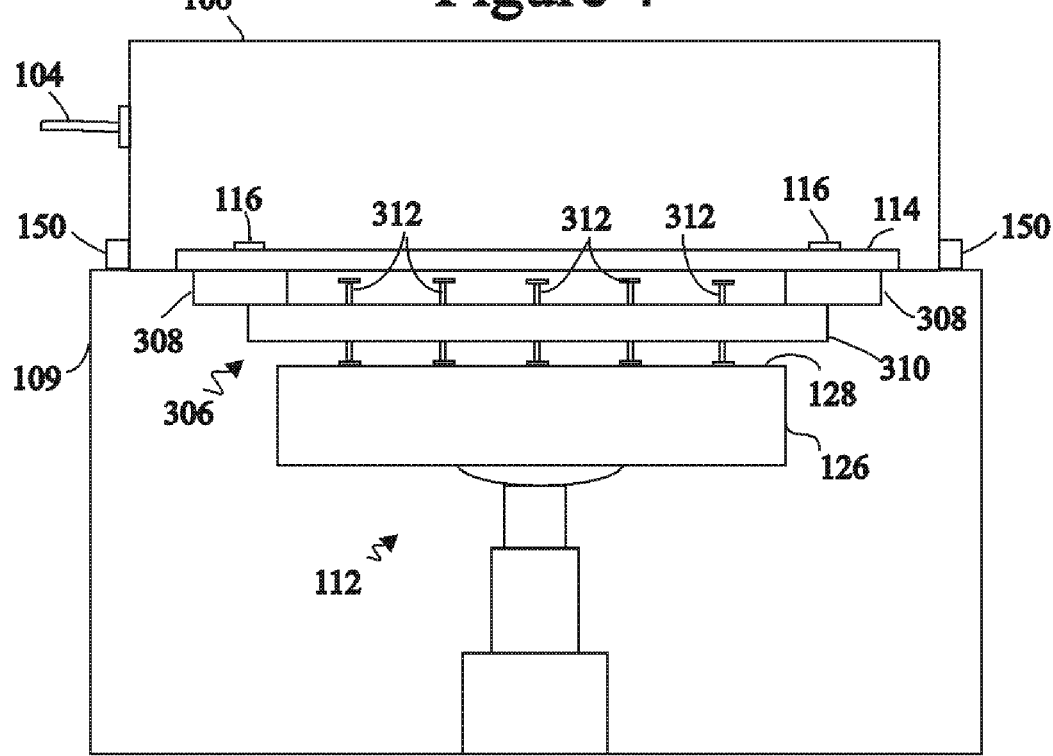

Still referring to FIG. 3, the push rods 312 are initially disposed in first positions. Planarity measuring apparatus 306 is configured so that the first positions of the push rods 312 correspond to a planarity of the prober head plate 114 (e.g., the push rods 312 may be the same length). The working surface 128 of the chuck 126 that holds a wafer (not shown in FIG. 3) is then moved into contact with the push rods 312. As shown in FIG. 4, the chuck 126 displaces the push rods 312 into second positions. It should be apparent that the second positions correspond to a planarity of the working surface 128 of chuck 126. The planarity of the prober head plate 114 with respect to the working surface 128 of chuck 126 may be determined by measuring the displacement of each of the push rods 312. The displacement of the push rods 312 may be measured in many different ways. For example, the displacement of each push rod may be measured manually (e.g., by manually measuring the distance each push rod moves above an upper surface of rod substrate 310). As another alternative, the displacements may be measured using automatic distance measuring devices. If the displacement of each of the push rods 312 is the same within a specified tolerance, then the prober head plate 114 and the working surface 128 of the chuck 126 are planar with respect to each other within the specified tolerance. If, on the other hand, the displacements of one or more of the push rods 312 with respect to others of the push rods 312 is greater than the specified tolerance, the prober head plate 114 and the working surface 128 of the chuck 126 are not planar with respect to each other. The difference in the displacement of specific push rods 312 and the locations of those push rods 312 may be used to determine where or how to adjust the planarity of one or both of the prober head plate 114 and the working surface 128 of the chuck 126.

Figure 5A:
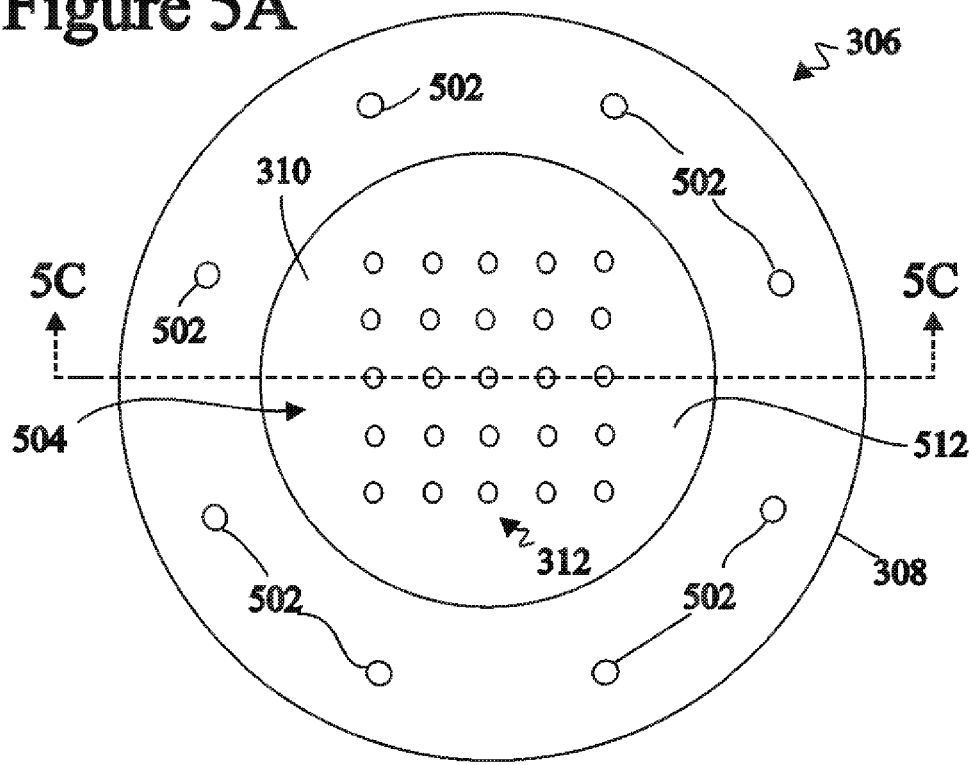
FIG. 5A illustrates a top view of the planarity measuring apparatus of FIGS. 3 and 4.
Figure 5B:
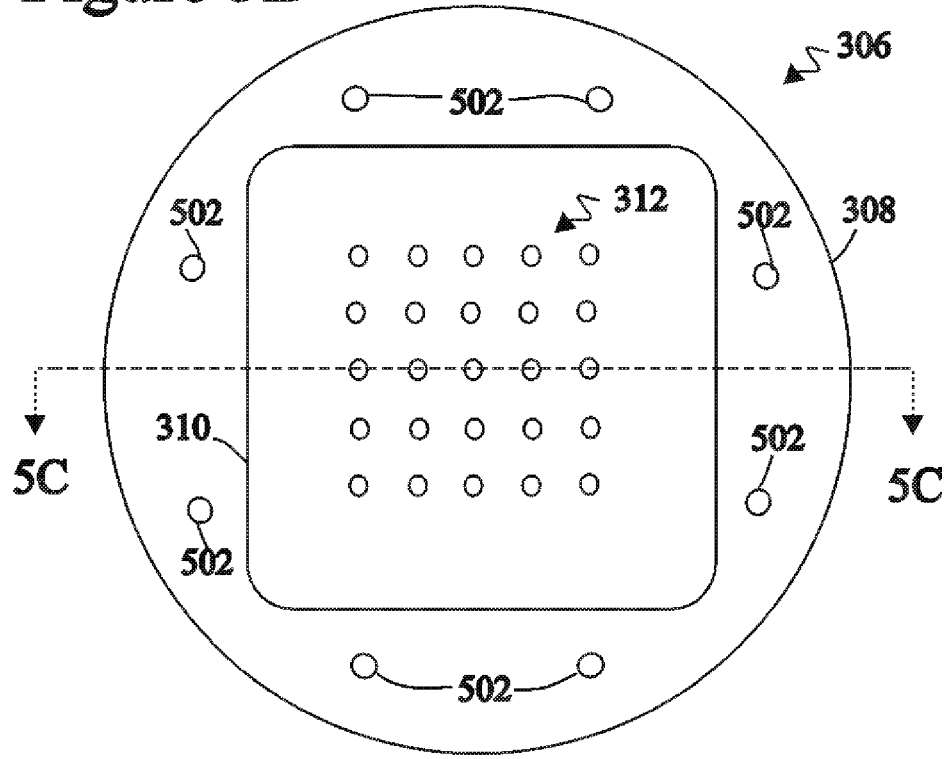
FIG. 5B illustrates a bottom view of the planarity measuring apparatus of FIGS. 3 and 4.
Figure 5C:
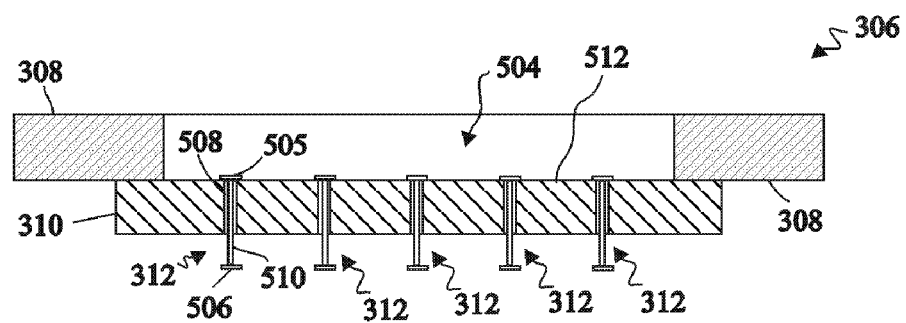
FIG. 5C illustrates a side cross-sectional view of the planarity measuring apparatus of FIGS. 3 and 4.

FIGS. 5A, 5B, and 5C illustrate an exemplary planarity measuring apparatus 306. FIG. 5A shows a top view of the planarity measuring apparatus 306; FIG. 5B shows a bottom view of the planarity measuring apparatus 306; and FIG. 5C shows a cross-sectional side view of the planarity measuring apparatus 306.

Figure 1:
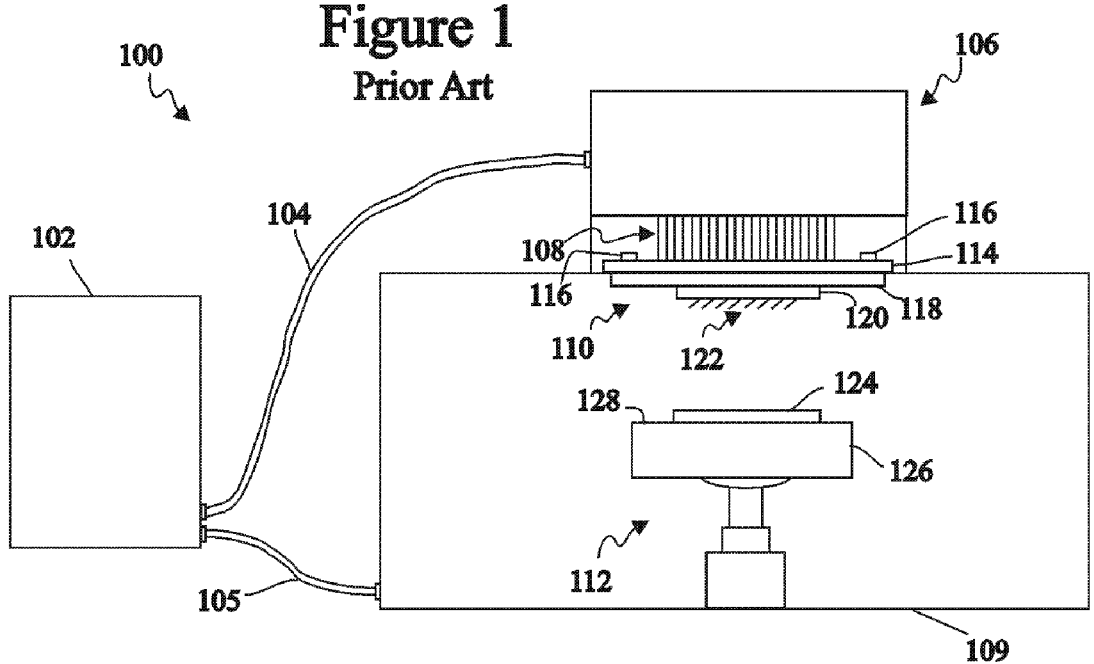
FIG. 1 illustrates an exemplary prior art probing system for contacting and testing a semiconductor wafer.
Figure 2:
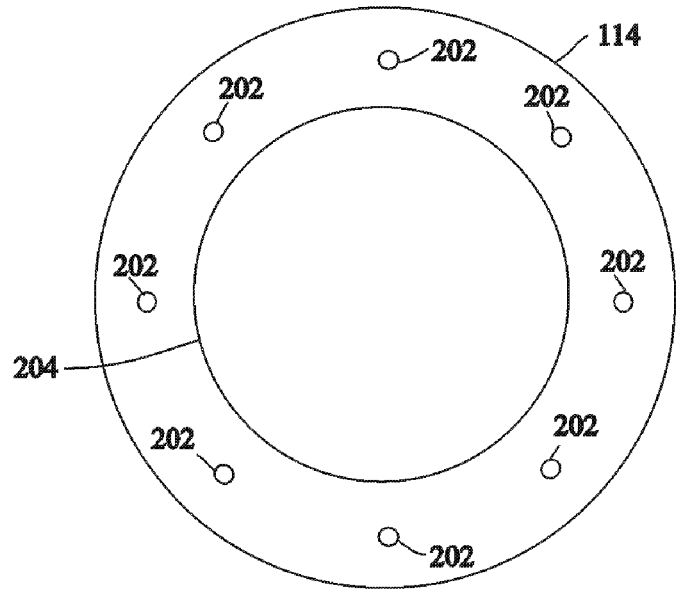
FIG. 2 illustrates a top view of a prober head plate from the probing system of FIG. 1.

Mounting board 308 may be any substrate suitable for securing to the prober head plate 114. Although the mounting board 308 may be any shape, it may be desirable for the mounting board 308 to be generally the same shape as the probe board 118 (see FIG. 1). This may facilitate mounting the planarity measuring apparatus 306 to the prober head plate 114. Holes 502 in mounting board 308 correspond to securing mechanisms 116 and facilitate securing the planarity measuring apparatus 306 to the prober head plate 114. The exemplary mounting board 308 shown in FIGS. 5A, 5B, and 5C includes a central opening 504, which provides space for displacement of the push rods 312.

As also shown in FIGS. 5A, 5B, and 5C, the rod substrate 310 is attached to the mounting board 308. Attachment of the rod substrate 310 to the mounting board 308 may be by any suitable means, including without limitation adhesive, epoxy, bolts, clamps, fasteners, etc. As best seen in FIG. 5C, each push rod 312 comprises an upper cap 505, a shaft 510, and a lower cap 506. The shaft 510 passes through a hole 508 in the rod substrate 310. Each push rod 312 is able to slide back and forth through the hole 508. Lubrication (not shown) may be introduced into the hole 508 or onto the shaft 510 to facilitate movement of the shaft 510 through the hole 508. The upper caps 505 and lower caps 506 of the push rods 312 prevent the push rods from sliding out of the holes 508 in the rod substrate 310. As shown in FIG. 5C, the upper caps 505 may rest against an upper surface of the rod substrate 310 while the planarity measuring apparatus 306 is secured to the prober head plate 114 and thus define initial positions of the push rods. When the working surface 128 of the chuck 126 is moved against the push rods 312 (as shown in FIG. 4), the working surface 128 of the chuck 126 presses against the lower caps 506 and displaces the push rods 312 through the holes 508. Although not shown in FIGS. 5A, 5B, or 5C, mechanisms may be included for locking the push rods into their displaced positions.

Planarity measurement apparatus 310 may be a probe card assembly 110 designed for use in prober 109 but modified to have push rods rather than probes 122. Moreover, no matter how configured, the planarity measuring apparatus 306 may include an array of push rods 312 that has more or fewer push rods than shown in FIGS. 5A and 5B. For example, it may be sufficient to include only push rods 312 at the corners of the array shown in FIGS. 5A and 5B. Indeed, three such push rods 312 may be sufficient, and in some applications, two push rods 312 may be sufficient. Nevertheless, the accuracy of the results may be improved by using many push rods (e.g., 25–35) and repeating the process of taking planarity measurements multiple times. In this, way individual measurements at each push rod can be compared among the multiple iterations of taking planarity measurements, and individual measurements that are clearly in error (e.g., displacement measurements that have an absolute value that exceeds an upper confidence level value or are significantly different from iteration to iteration) can be corrected or discarded.

Figures 6A, 6B, 6C:
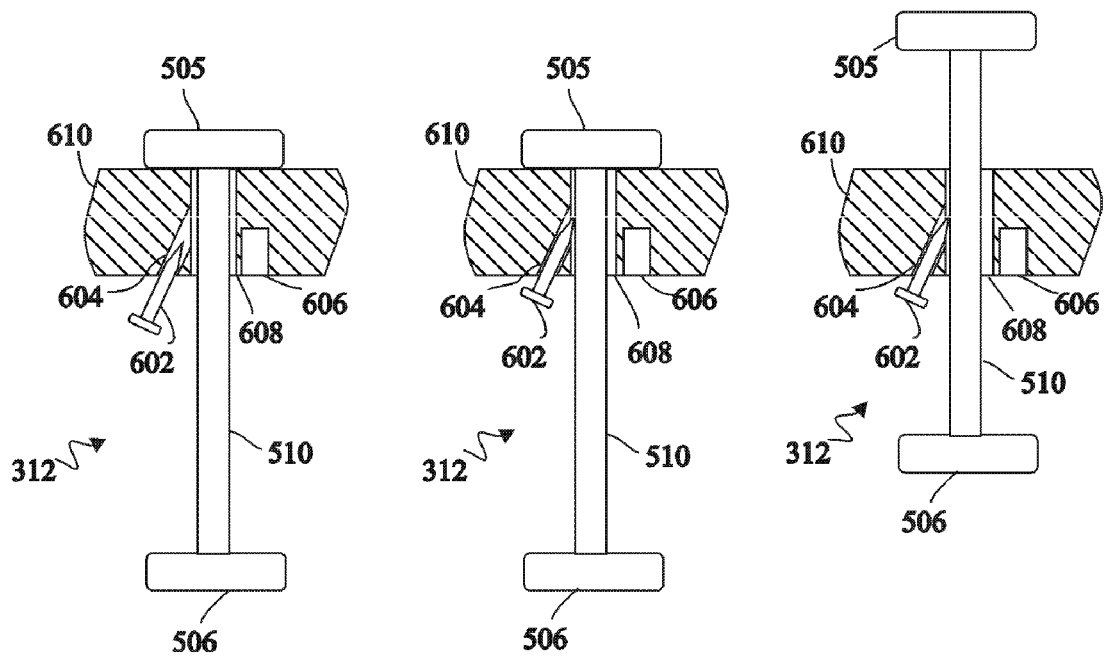
FIGS. 6A, 6B, and 6C illustrate a partial side cross-sectional view of an exemplary push rod substrate and a push rod.

FIGS. 6A, 6B, and 6C illustrate an exemplary mechanism for locking push rods 312 into displaced positions. FIGS. 6A, 6B, and 6C show a partial, cross-sectional side view of a rod substrate 610, which may be generally similar to rod substrate 310, and one push rod 312. Of course, however, rod substrate 610 may include a plurality of push rods 312. In FIGS. 6A and 6B, push rod 312 is in an initial non-displaced position; in FIG. 6C, push rod 312 is in a displaced position. As shown, push rod 312 includes an upper cap 505, a shaft 510, and a lower cap 506 as described above. The shaft 510 may slide up and down (where directions are relative to FIGS. 6A, 6B, and 6C) in hole 608.

As shown, rod substrate 610 includes a threaded passage 604 into which threads a screw 602. As shown in FIGS. 6A and 6B, screw 602 is tightened against the shaft 510 of push rod 312 while the push rod 312 is in the initial non-displaced position. Because screw 602 is angled as shown in FIGS. 6A, 6B, and 6C, shaft 510 may slide upward (where directions are relative to FIGS. 6A, 6B, and 6C) away from its initial non-displaced position, but the tip of screw 602 prevents the shaft 510 from sliding downward. Thus, screw 602 holds push rod 312 in its displaced position as shown in FIG. 6C. The tip of screw 602 that engages the shaft 510 of the push rod 312 may be coated with a material that reduces damage to the shaft 510 and facilities the upward movement of the shaft 510. For example, the tip of screw 602 may be nylon.

Still referring to FIGS. 6A, 6B, and 6C, rod substrate 610 may include a device 606 for measuring the position of lower cap 506. For example, device 606 may measure the distance to lower cap 506 by directing sound or light waves at lower cap 506 and measuring the length of time a return echo of sound or light is detected. By measuring the distance to lower cap 506 while push rod 312 is in the initial non-displaced position shown in FIGS. 6A and 6B and then measuring the distance to lower cap 506 while push rod 312 is in a displaced position shown in FIG. 6C, the amount of displacement of the push rod 312 may be determined.

Push rod 312 may be returned from the displaced position shown in FIG. 6C to the initial non-displaced position shown in FIGS. 6A and 6B by loosening screw 602, which allows shaft 510 to slide downward.

Figure 7A:
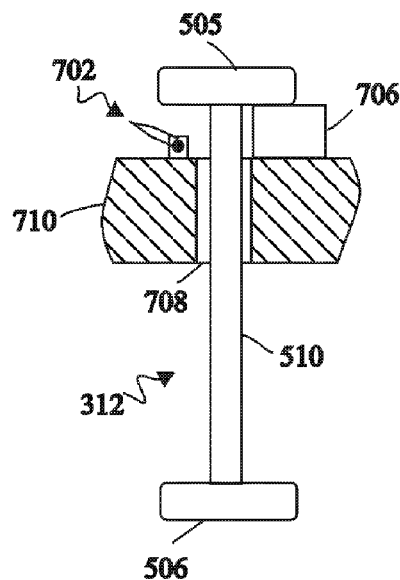
FIGS. 7A, 7B, and 7C illustrate a partial side cross-sectional view of another exemplary push rod substrate and a push rod.
Figure 7B:
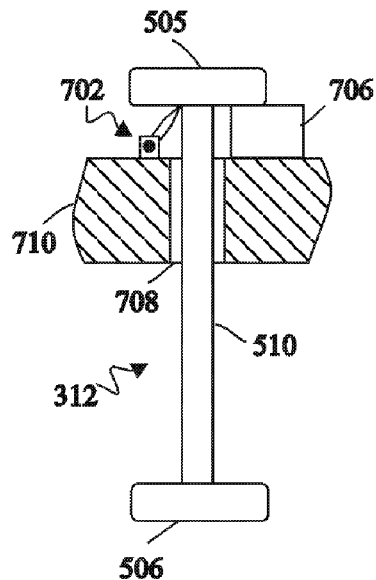
Figure 7C:
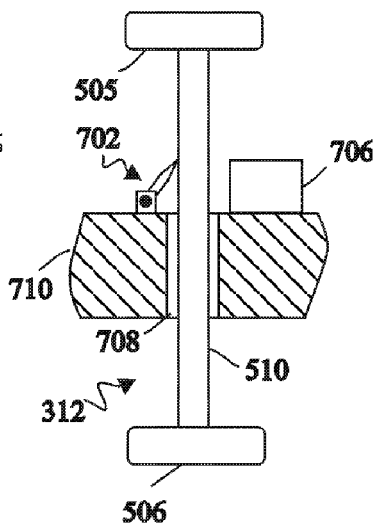

FIGS. 7A, 7B, and 7C illustrate another exemplary mechanism for locking push rods 312 into displaced positions. FIGS. 7A, 7B, and 7C show a partial, cross-sectional side view of a rod substrate 710, which may be generally similar to rod substrate 310 and which may include a plurality of push rods 312. In FIGS. 7A and 7B, push rod 312 is in an initial non-displaced position; in FIG. 7C, push rod 312 is in a displaced position. Again, push rod 312 includes an upper cap 505, a shaft 510, and a lower cap 506 as described above, and the shaft 510 may slide up and down (where directions are relative to FIGS. 7A, 7B, and 7C) in hole 708.

Rather than a screw 602 as in FIGS. 6A, 6B, and 6C, the rod substrate 710 of FIGS. 7A, 7B, and 7C includes a stop structure 702 that may be rotated into and out of contact with shaft 510 of push rod 312. As shown in FIG. 7A, push rod 312 is brought into an initial non-displaced position (shown in FIGS. 7A and 7B) by rotating stop structure 702 out of contact with shaft 510, which allows shaft 510 to slide freely up and down through hole 708. Note that, as shown in FIGS. 7A and 7B, the initial non-displaced position for push rod 312 is with upper cap 505 resting on a distance measuring device 706, which measures the distance to upper cap 505 but otherwise may be generally similar to distance measuring device 606. As shown in FIG. 7B, the stop structure 702 is then rotated into contact with shaft 510. Like screw 602, stop structure 702 is angled as shown in FIGS. 7B and 7C into shaft 510, allowing the shaft 510 to slide upward (where directions are relative to FIGS. 7A, 7B, and 7C) away from its initial non-displaced position, but the tip of stop structure 702 prevents the shaft 510 from sliding downward. Stop structure 702 thus holds push rod 312 in its displaced position as shown in FIG. 7C. Like screw 602, the tip of stop structure 702 may be coated with a material (e.g., nylon) that reduces damage to the shaft 510 and facilities the upward movement of the shaft 510.

As mentioned above, distance measuring device 706 measures the distance to upper cap 505. Because the initial non-displaced position of the push rod 312 is resting against the distance measuring device 706 as shown in FIG. 7A and 7B, the distance measured to the upper cap 505 while the push rod 312 is in a displaced position as shown in FIG. 7C is the displacement distance.

Figure 8:
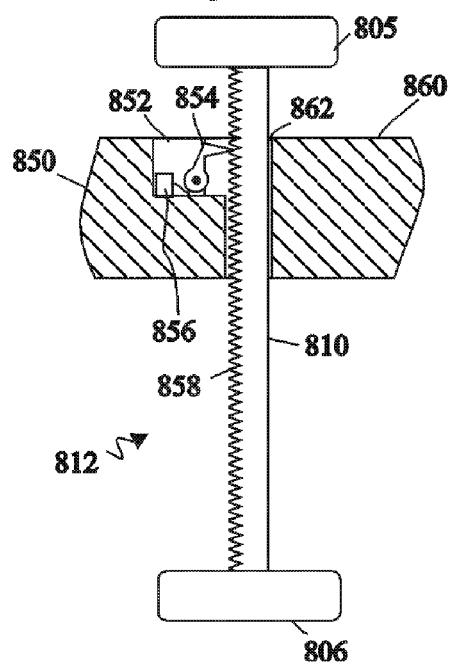
FIG. 8 illustrates a partial side cross-sectional view of yet another exemplary push rod substrate and a push rod.

FIG. 8 shows another exemplary push rod 812, which is disposed in a rod substrate 850 (which is shown in partial view in FIG. 8 but may be generally similar to rod substrate 310 and may include a plurality of push rods 812). As shown in FIG. 8, push rod 812 includes an upper cap 805 and a lower cap 806, which may be generally similar to upper and lower caps 505 and 506. Shaft 810, however, includes teeth 858. Locking mechanism 854 on rod substrate 850 is spring loaded so as to allow the push rod to move upward but not downward (where directions are relative to FIG. 8). Push rod 812 is moved into an initial non-displaced position with upper cap 805 resting on a surface 860 of rod substrate 850 by releasing locking mechanism 854, which allows shaft 810 to move freely up and down through passage 862 in rod substrate 850, as shown in FIG. 8A. Locking mechanism 854 is then moved into a position in which it engages teeth 858 as shown in FIG. 8. Push rod 812 may then move upwards into a displaced position (not shown in FIG. 8 but similar to FIGS. 6C and 7C). The spring loading of locking mechanism 854 does not, however, allow the push rod 812 to move downward (where directions are relative to FIG. 8).

As shown in FIG. 8, a distance measuring device 856 may be included for measuring the distance to upper cap 805. Distance measuring device 856 may be similar to device 606 except distance measuring device 856 is positioned to measure the distance to upper cap 805 rather than lower cap 806. As also shown in FIG. 8, distance measuring device 856 and locking mechanism 854 may be disposed in a cavity 852 in rod substrate 850.

Figure 9:
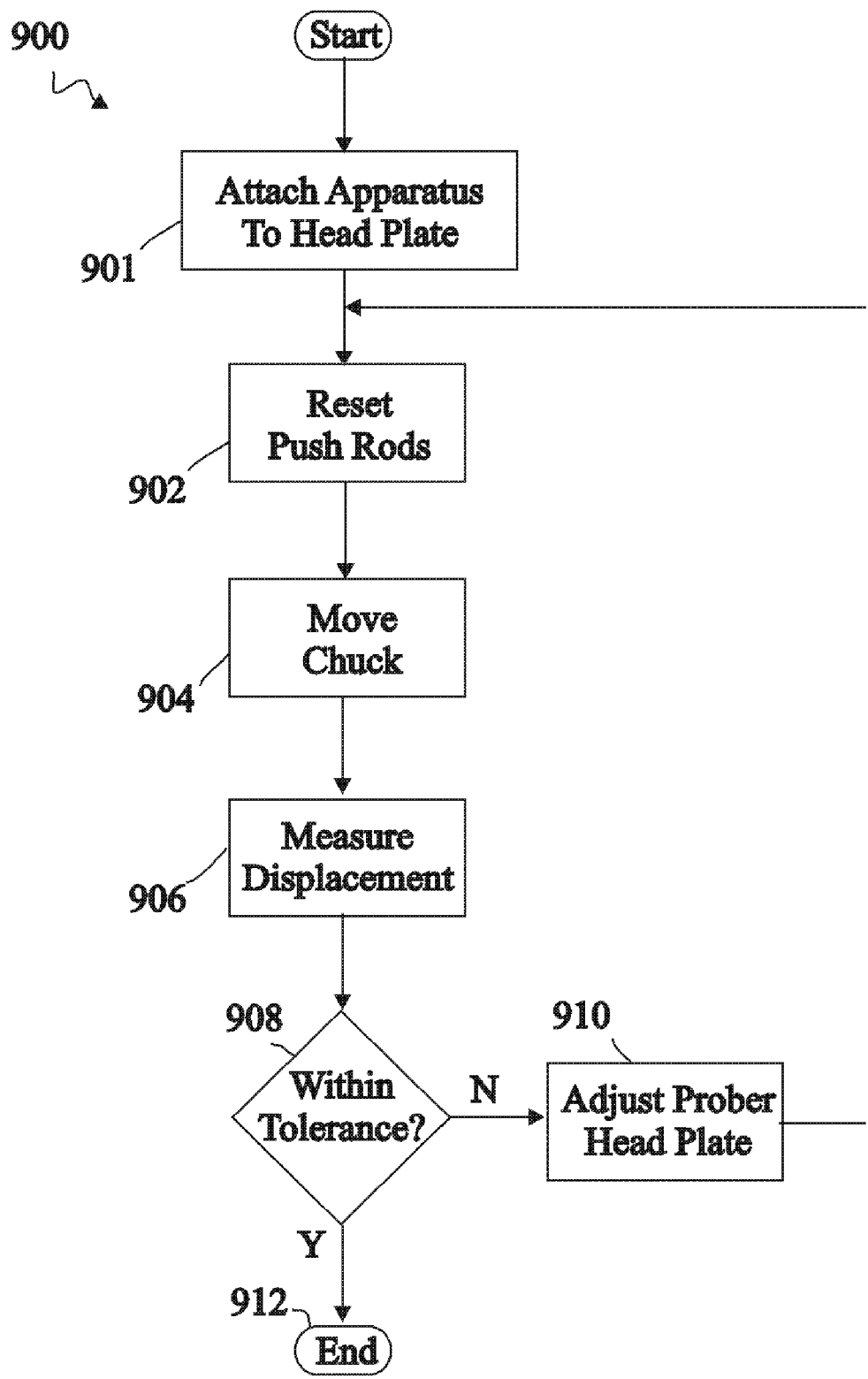
FIG. 9 illustrates an exemplary method for bringing the planarity of the prober head plate to within a specified tolerance of the working surface of the chuck of the prober of FIG. 3.

FIG. 9 illustrates an exemplary method 900 for verifying and adjusting the planarity of the prober head plate 114 in FIG. 3 with respect to the working surface 128 of chuck 126 in FIG. 3. As shown in FIG. 9, at step 901, the planarity measuring apparatus 306 (see FIG. 3) is attached to the prober head plate 114 by securing mechanism 116. Although the probe card assembly (e.g., 110 in FIG. 1) is, of course, removed and replaced with the planarity measuring apparatus 306, there is no need to remove or even to move the test head 106, which may be left in its "test position" (i.e., the position of test head 106 during normal operation to test a semiconductor device or other electronic device disposed on the chuck 126). Thus, the test head 106 may be left secured by securing means 150 to prober 109 in a "test position" as shown in FIGS. 3 and 4. Of course, however, the test head 106 may be removed or moved. Securing means 150 may be any suitable means for securing the test head 106 to the prober 109. For example, securing means 150 may comprise bolts, screws, clamps, latches, etc. and may also include bosses (e.g., protrusions, balls, studs, etc.) on one of the prober 109 or the test head 106 that fit into recesses on the other of the prober 109 or the test head 106.

At step 902, the push rods 312 are reset to initial non-displaced positions. FIG. 3 shows planarity measuring apparatus 306 secured to prober head plate 114 and push rods 312 in initial non-displaced positions. Push rods as shown in any of FIGS. 6A, 6B, 6C, 7A, 7B, 7C, or 8 may be used and reset as described above with respect to those figures. At step 904, stage 112 moves chuck 126 such that the working surface 128 is pressed against and displaces push rods 312, as shown in FIG. 4.

At step 906, the displacements of the push rods 312 are measured. The displacements of the push rods 312 may be measured in any suitable manner including using manual measuring devices or automatic measuring devices, such as measuring devices 606, 706, or 856 in FIGS. 6A, 6B, 6C, 7A, 7B, 7C, and 8. At step 908, the measured displacements of the push rods 312 are compared to each other to determine whether the difference in displacements between any two push rods 312 exceeds a specified tolerance. If the difference in displacements between any two push rods 312 does not exceed the specified tolerance, the prober head plate 114 and working surface 128 of the chuck 126 are sufficiently planar with respect to each other, and the method 900 ends at 912. If the difference in displacements between any two push rods 312 exceeds the specified tolerance (at step 908), the prober head plate 114 and working surface 128 of the chuck 126 are out of planarity with respect to each other, and the method 900 branches to step 910, where the planarity of the prober head plate 114 is adjusted. Alternatively or in addition, the planarity of the working surface 128 of the chuck 126 may be adjusted at step 910. The method 900 is then repeated as shown in FIG. 9.

Steps 902, 904, and 906 may be repeated several times (e.g., three or more) before determining at step 908 whether the prober head plate 114 is planar with respect to the chuck surface 128. In such a case, step 908 may be performed as follows. For each iteration of steps 902, 904, and 906, a set of measured displacements of each push rod 312 is recorded. Before using the measured displacements to determine the planarity of the prober head plate 114 with respect to the chuck surface 128, the individual measurements may be scrutinized to identify and discard or correct values that are suspect or clearly in error. For example, all measured displacements of a push rod 312 that exceed an upper confidence level value may be corrected or discarded, and any measured displacement of a push rod 312 during a particular iteration of steps 902, 904, and 906 that is significantly different than measurements of the same push rod 312 during other iterations of steps 902, 904, and 906 may also be corrected or discarded. Thereafter, for each iteration of steps 902, 904, and 906, the measured displacements of the push rods 312 may be used along with the locations of the push rods to determine an imaginary plane through the push rod displacement locations that represents the cumulative "best fit" plane through the measured displacements of the push rods. The imaginary plane has a characteristic slope. That slope represents the degree of planarity (or lack of planarity) of the prober head plate 114 with respect to the chuck surface 128. Average values from each iteration of steps 902, 904, and 906 may be used to arrive at a final slope value, which is then used at step 908 to determine whether the planarity of the prober head plate 114 with respect to the chuck surface 128 is sufficiently planar. For example, a slope value may be calculated for each iteration of steps 902, 904, and 906, and then all of the slope values from all of the iterations may be averaged to arrive at a final slope value. Alternatively, the measured displacements for each push rod 312 in each iteration of steps 902, 904, and 906 may be averaged to create one set of average push rod 312 displacements from which a final slope value is then calculated.

Figure 10:
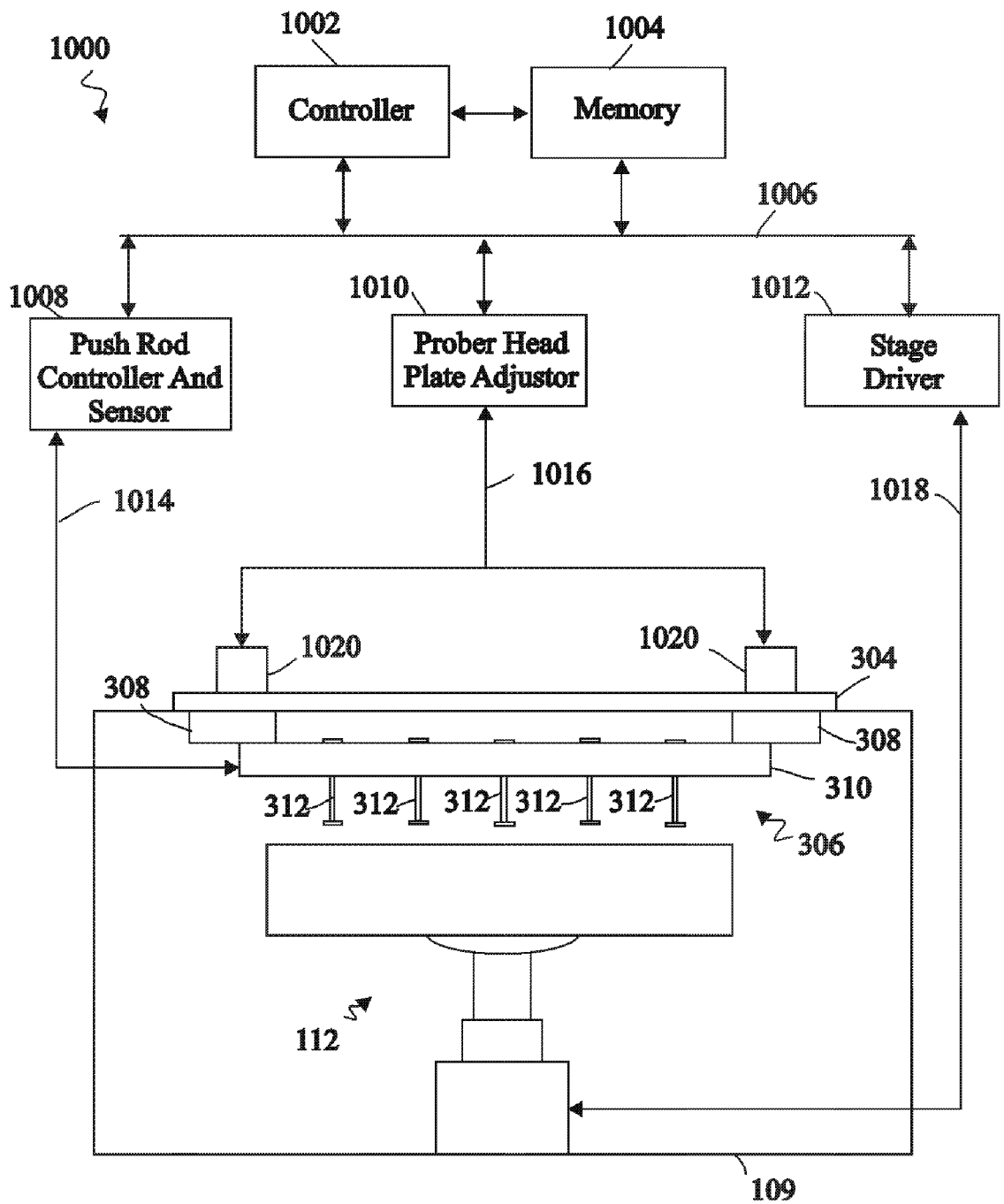
FIG. 10 illustrates an exemplary automated system for bringing the planarity of a prober head plate to within a specified tolerance of a working surface of a chuck in a prober.

FIG. 10 illustrates an exemplary system 1000 in which the method 900 of FIG. 9 may be automated in whole or in part. As shown in FIG. 10, the system 1000 includes a controller 1002, which may be a microprocessor or other digital-electronic controller. (Indeed, controller 1002 may be a computer.) Memory 1004, which may be any type of memory including without limitation a semiconductor memory, a magnetic memory, an optical memory, etc., stores program code that is executed by controller 1002. Parameters and other data may also be stored in memory 1004, and controller 1002 may be configured to read from and write to memory 1004 as needed. System 1000 also includes a push rod controller and sensor 1008, which controls push rods 312 in planarity measuring mechanism 306. Push rod controller and sensor 1008 also determines the displacements of the push rods 312. Push rod controller and sensor 1008 communicates with the planarity measuring device 306 via communications element 1014, which may be any type of electronics communication device for communicating control and sensor data (e.g., a data bus). Rod substrate 310 includes control and sensor mechanisms (not shown in FIG. 10) associated with the push rods 312. For example, rod substrate 310 may include a stop structure like stop structure 702 shown in FIGS. 7A, 7B, and 7C, or rod substrate 310 may include a locking mechanism like locking mechanism 854 shown in FIG. 8. Similarly, rod substrate 310 may include a distance measuring device like any of distance measuring devices 606, 706, or 856 shown in FIGS. 6A, 6B, 6C, 7A, 7B, 7C, and 8. Push rod controller and sensor 1008 sends control signals to and receives data signals from such stop structures or locking mechanisms and distance measuring devices via communications element 1014. Push rod controller and sensor 1008 is thus able to move a stop structure like 702 of FIGS. 7A, 7B, and 7C or a locking mechanism like 854 of FIG. 8 into a locking position (e.g., as shown in FIGS. 7B, 7C, and 8) or out of a locking position (e.g., as shown in FIG. 7A) and to read distance data from distance measuring devices (e.g., 606, 706, or 856 of FIGS. 6A, 6B, 6C, 7A, 7B, 7C, and 8).

Prober head plate adjustor 1010 is also included in system 1000. Prober head plate adjustor 1010 adjusts the planarity of prober head plate 114 by communicating control signals over communications element 1016 to adjustment elements 1020. Adjustment elements 1020 may be any suitable actuator for altering the planarity of prober head plate 114. For example, adjustment elements 1020 may be motor driven screws or bolts. Stage driver 1012 controls movement of stage 112 within prober 109. Communications element 1018 provides communication between stage driver 1012 and stage 112. Communications element 1006 provides communications among the controller 1002, memory 1004, push rod controller and sensor 1008, prober head plate adjustor 1010, and stage driver 1012. Communications elements 1006, 1016, and 1018 may be similar to communications element 1014 (e.g., data buses). As would be readily apparent to persons of ordinary skill in the field, push rod controller and sensor 1008, prober head plate adjustor 1010, and stage driver 1012 may comprise a combination of electronics (including a software controlled processor) and mechanical actuators. Push rod controller and sensor 1008, prober head plate adjustor 1010, and stage driver 1012 may be implemented at least in part in controller 1002.

The exemplary method 900 shown in FIG. 9 may be implemented in program code stored in memory 1004 and run on controller 1002 of system 1000. In such an implementation, controller 1002 resets push rods (step 902 of FIG. 9) by issuing control signals over communications element 1006 to push rod controller and sensor 1008, which issues commands over communications element 1014 to mechanisms such as stop structure 702 or locking mechanism 854 on rod substrate 310 to reset push rods 312 to initial non-displaced positions. Push rod controller and sensor 1008 may also receive signals over communications element 1014 indicating positions of push rods 312, which may in turn be sent to controller 1002 over communications element 1006. Once the push rods 312 are reset, controller 1002 moves the stage 112 into contact with push rods 312 (step 904 of FIG. 9), displacing the push rods 312. Controller 1002 may do so by issuing control signals over communications element 1006 to stage driver 1012, which in turn issues commands over communication element 1018 controlling movement of stage 112. Signals indicating the position or other data regarding stage 112 may be communicated over communications element 1018 to stage driver 1012, and controller 1002 may access such information from stage driver 1012 via communications element 1006. Push rods 312 are now displaced, as shown in FIG. 4. As mentioned above, rod substrate 310 may include sensors (e.g., like distance measuring devices 606, 706, or 856 shown in FIGS. 6A, 6B, 6C, 7A, 7B, 7C, and 8) for determining the displacement of the push rods 312, and push rod controller and sensor 1008 may receive signals indicating the displacement of the push rods 312 over communications element 1014. Controller 1002 implements step 906 of FIG. 9 by reading data from push rod controller and sensor 1008 over communication element 1006 indicating the displacement of the push rods 312. Controller 1002 then determines whether the differences in displacements among the push rods 312 is within a specified tolerance (step 908 of FIG. 9). Controller 1002 may do so in any suitable manner. For example, controller 1002 may determine the maximum and minimum displacements of the push rods 312 and then determine the difference between the maximum and minimum displacements. If the differences in displacements among the push rods 312 is determined to be outside of the tolerance, controller 1002 signals prober head plate adjustor 1010 over communications element 1006 to adjust the planarity of the prober head plate 114 (step 910 of FIG. 9). For example, controller may issue commands to prober head plate adjustor 1010 that cause prober head plate adjustor 1010 to alter the planarity of prober head plate 114 by a specified amount. Prober head plate adjustor 1010 does so by issuing control signals over communications element 1016 to adjustment elements 1020. Once controller 1002 determines at step 908 of FIG. 9 that the displacements of the push rods are within the specified tolerance, controller 1002 may output (not shown) an indication that the prober head plate 114 and stage 112 are planar with respect to each other.

The controller 1002, memory 1004, push rod controller and sensor 1008, prober head plate adjustor 1010, and stage driver 1012 may reside in the prober 109 or in other places or may reside in part in the prober 109 and in part in other places. For example, one or more of those elements may reside in a tester (e.g., 102 in FIG. 1), the test head (e.g., 106 in FIG. 1), or a separate entity (not shown). As yet another alternative, all or part of one or more of the controller 1002, memory 1004, push rod controller and sensor 1008, prober head plate adjustor 1010, and stage driver 1012 may reside on the planarity measuring apparatus 306.

It should be apparent that the system 1000 shown in FIG. 10 is exemplary only. For example, the system 1000 need not be fully automated. For example, the prober head plate adjustor 1010 may be eliminated. In such an implementation, the controller 1002 may output for a user information indicating displacements of the push rods 312, and the user may use that information to manually adjust the planarity of the prober head plate 114 if needed (steps 908 and 910 of FIG. 9).

Figure 11A:
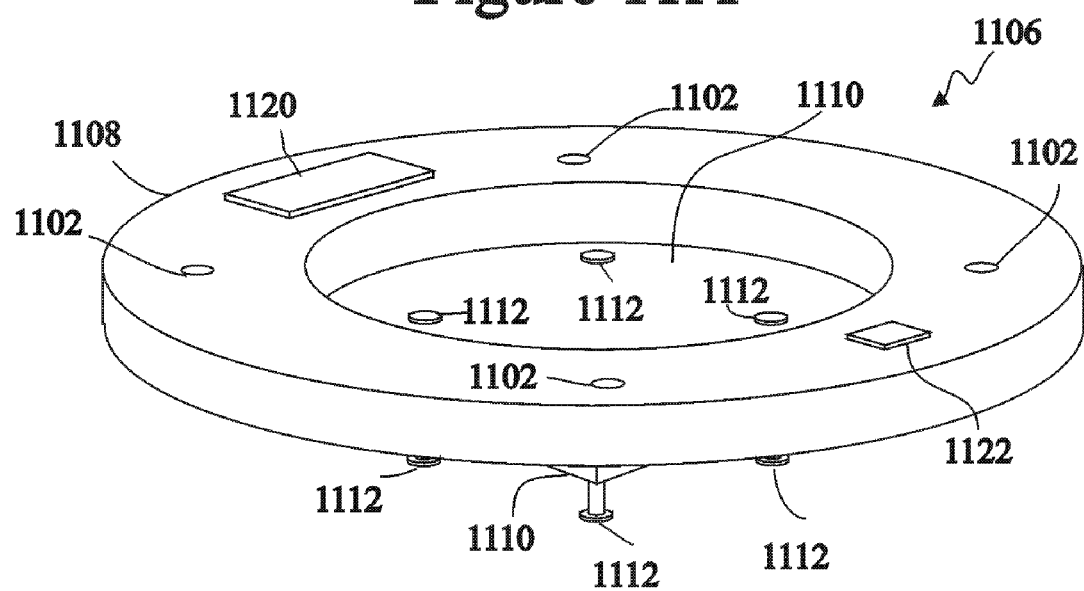
FIG. 11A illustrates a perspective top view of an exemplary planarity measuring apparatus.
Figure 11B:
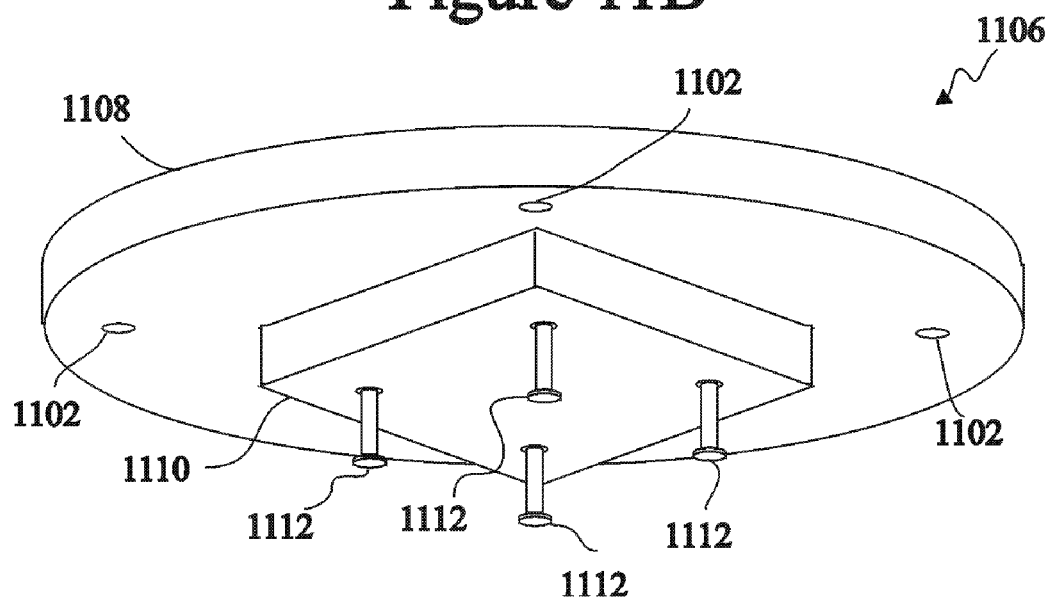
FIG. 11B illustrates a perspective bottom view of the exemplary planarity measuring apparatus of FIG. 11A.

FIGS. 11A and 11B illustrate another exemplary planarity measuring apparatus 1106. (FIG. 11A illustrates a perspective top view of the planarity measuring apparatus 1106, and FIG. 11B illustrates a perspective bottom view.) As shown, the planarity measuring apparatus 1106 includes a mounting board 1108 (which may be generally similar to mounting board 308, as discussed above) and a rod substrate 1110 (which may be generally similar to rod substrate 310, as discussed above). Holes 1102 in mounting board 1108 are for securing the planarity measuring apparatus 1106 to a prober head plate, like prober head plate 114. Four push rods 1112 are disposed in holes through rod substrate 1110. (Push rods 1112 may be generally similar to push rods 312 and may be moveably disposed in push rod substrate 1110 in the same way that push rods 312 are disposed in rod substrate 310, 610, 710, or 850, as discussed above.) Of course, more or fewer push rods 1112 may be used, and the push rods 1112 need not be disposed in the corners of rod substrate 1110 as shown in FIGS. 11A and 11B.

Planarity measuring apparatus 1106 also includes an electronics module 1120 that may be configured to automate part or all of a process in which the apparatus 1106 is used to determine the relative planarity between a prober head plate 1114 and the working surface 128 of a chuck 126. Planarity measuring apparatus 1106 also includes a reset switch 1122 that resets push rods 1112 into initial non-displaced positions (similar to step 902 of FIG. 9). For example, rod substrate 1110 may include a stop structure like 702 of FIGS. 7A, 7B, and 7C or a locking mechanism like 854 of FIG. 8, and reset switch 1122 may be configured to move such a stop structure or locking mechanism into positions that allow the push rods 1112 to move into initial, non-displaced positions (e.g., as shown in FIG. 7A) and then move the stop structure or locking mechanism into a position that allows the push rods 1112 to move into displaced positions and then holds the push rods 1112 in the displaced positions (e.g., as shown in FIGS. 7B, 7C, and 8).

Figure 12:
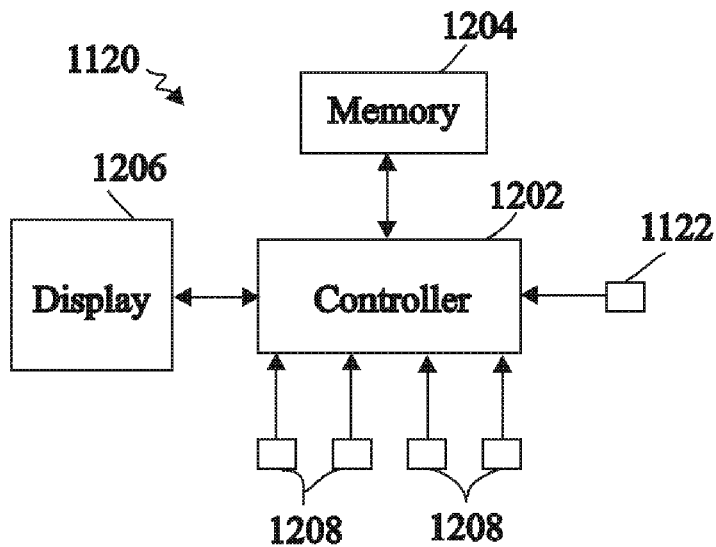
FIG. 12 illustrates a schematic diagram of an exemplary implementation of the electronics module of FIG. 11A.
Figure 13:
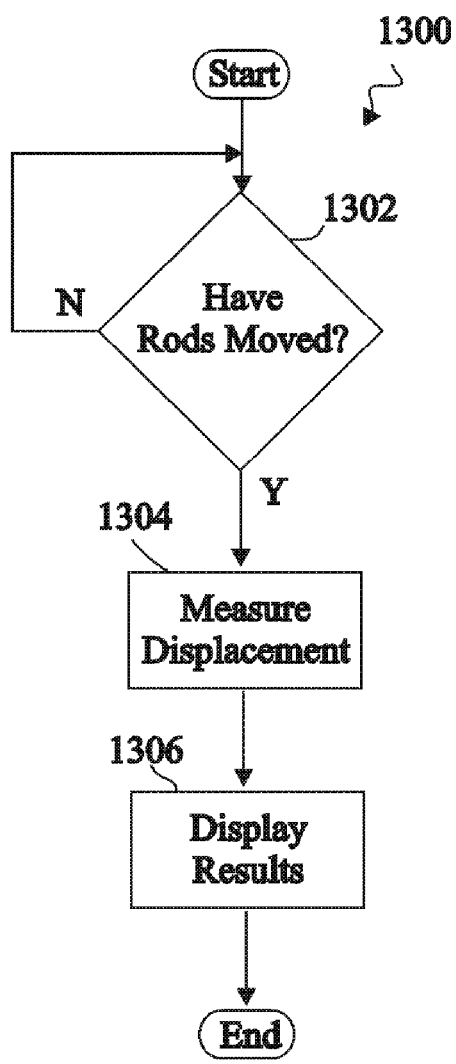
FIG. 13 illustrates an exemplary method of operation of the controller of FIG. 12.

FIG. 12 illustrates an exemplary configuration of electronics module 1120, and FIG. 13 illustrates an exemplary method that may be implemented on controller 1202 of FIG. 12. As shown in FIG. 12, the electronics module 1120 includes a controller 1202, which may be a microprocessor or microcontroller that operates under control of software (e.g., software, firmware, microcode, etc.) stored in memory 1204 (which may be any type of electronic memory including without limitation a semiconductor memory, a magnetic memory, or an optical memory). (Controller 1202 and memory 1204 may thus be similar to controller 1002 and memory 1004 in FIG. 10.) As shown in FIG. 12, controller 1202 communicates with reset switch 1122, distance measuring devices 1208, memory 1204, and a display 1206. Each distance measuring device 1208 is associated with and measures the distance to a part of one of the push rods 1112. Distance measuring devices 1208 may be generally similar to distance measuring device 606, 706, or 856 in FIGS. 6A, 6B, 6C, 7A, 7B, 7C, or 8. That is, each distance measuring device 1208 measures the distance to a part of a push rod 1112 and inputs such distance data to the controller 1202. Display may be any apparatus configured to display information, including without limitation a light-emitting-diode display, a liquid crystal display, a plasma display, a cathode-ray-tube display, etc.

As mentioned above, software stored in memory 1204 and run on controller 1202 may be configured to cause controller 1202 to execute the exemplary method shown in FIG. 13. To planarize a prober head plate 114 and working surface 128 of a chuck 126 in a prober 109 as shown in FIG. 3, the planarity measuring apparatus 1106 of FIGS. 11A and 11B is first secured to the prober head plate 114 (which may be similar to step 901 in FIG. 9). (As described above with respect to FIG. 9, there is no need to remove or even move the test head 106, which may remain secured to the prober 109 in a "test position." Of course, however, the test head 106 may be removed or moved.) The reset switch 1122 is then activated, resetting the push rods 1112 to initial, non-displaced positions (which may be similar to step 902 in FIG. 9), after which the chuck 126 is moved into contact with the push rods, which moves the push rods into displaced positions (as shown in FIG. 4 and similar to step 904 in FIG. 9).

Activation of the reset switch 1122, signals controller 1202 to start the method shown in FIG. 13. As shown in FIG. 13, after the reset button 1122 is activated (indicating that the push rods 1112 have been reset into initial, nondisplaced positions), the controller waits until the push rods 1112 move into displaced positions (step 1302 in FIG. 13) (which occurs when the chuck 126 is brought into contact with the push rods 1112). The controller 1202 may determine that the push rods 1112 have moved into displaced positions by monitoring inputs from distance measuring devices 1208 indicating the distance to a particular part of the push rods 1112. Once that distance changes and then remains the same for a specified period of time, the controller 1202 may conclude that the push rods 1112 have moved into displaced positions. Using input from the distance measuring devices 1208, the controller 1202 then determines at step 1304 the distance that each push rod 1112 moved, and at step 1306, the controller 1202 outputs to the display 1206 the distance moved by each push rod 1112. A user may then read the display 1206 and determine whether the differences in the distances moved by the push rods 1112 requires adjusting the planarity of the prober head plate 114 or the chuck 126 (e.g., like steps 908 and 910 of FIG. 9).

Of course, the configuration shown in FIG. 12 and the method shown in FIG. 13 are exemplary only. For example, rather than output the distance moved by each push rod 1112 at step 1306, controller may be configured to analyze the distance measurements obtained at step 1304, and the output (step 1306) may indicate whether the prober head plate 114 is out of planarity and if so, how and where to alter the planarity of the prober head plate 114 to bring it into planarity with the working surface 128 of the chuck 126. As yet another alternative, rather then display results at step 1306, controller 1202 may output control signals to adjustment mechanisms similar to 1020 in FIG. 10 for automatically adjusting the planarity of the prober head plate 114.

Figure 14A:
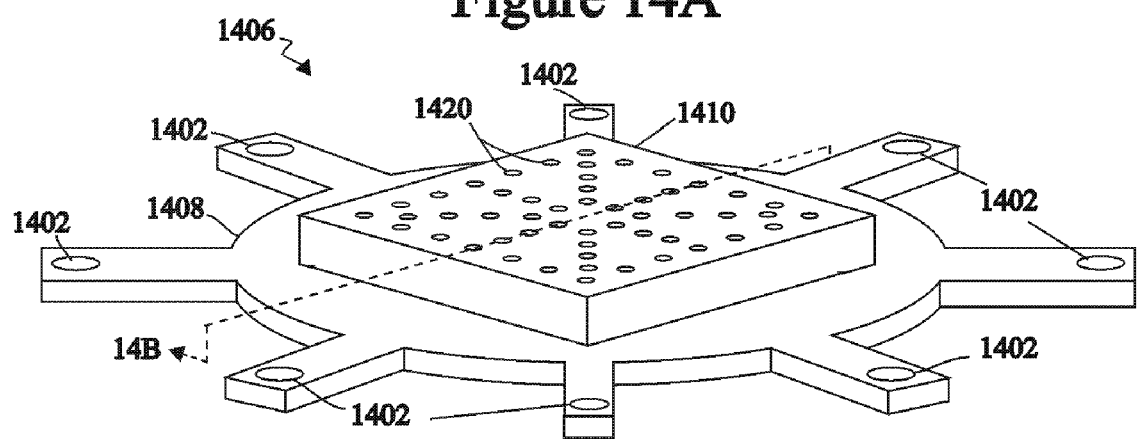
FIG. 14A illustrates another exemplary planarity measuring apparatus.
Figure 14B:
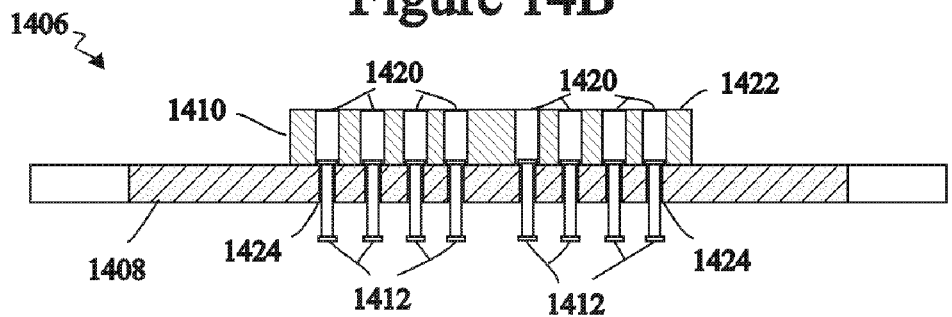
FIG. 14B illustrates a cross-sectional side view of the planarity measuring apparatus of FIG. 14A in which the push rods are in non-displaced positions.
Figure 14C:
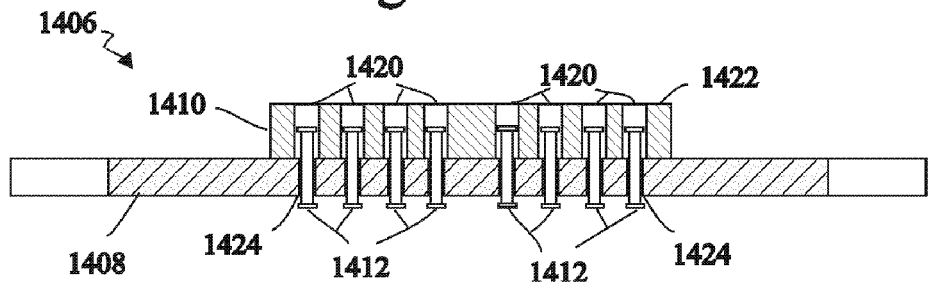
FIG. 14C illustrates a cross-sectional side view of the planarity measuring apparatus of FIG. 14A in which the push rods are in displaced positions.

FIG. 14A illustrates another exemplary planarity measuring apparatus 1406 comprising a mounting board 1408 and a rod substrate 1410. FIG. 14B shows a cross-sectional side view of the planarity measuring apparatus 1406 with the push rods 1412 in non-displaced positions; FIG. 14C shows the same cross-sectional side view of planarity measuring apparatus 1406 but with the push rods 1412 in displaced positions.

In the embodiment shown in FIGS. 14A–14C, passages 1424 and 1420 are provided for push rods 1412 through the mounting board 1408 and the rod substrate 1410, respectively. Probe substrate 1410 (which may comprise a ceramic substrate, a printed circuit board material, metal, etc.) may be attached to the mounting board 1408 using brackets, screws, bolts, adhesive, etc. (not shown) or any other suitable means. (Mounting board 1408 may comprise a printed circuit board, metal, etc.) Alternatively, rod substrate 1410 may be integrally formed with mounting board 1408. Holes 1402 in mounting board 1408 receive securing mechanism 116 and are thus for securing the planarity measuring apparatus 1406 to the prober head plate 114. Locking mechanisms (not shown in FIGS. 14A–14C) for holding each push rod 1412 in a displaced position, such as screw 602 (and passage 604) in FIGS. 6A–6C, stop structure 702 in FIGS. 7A–7C, and locking mechanism 854 in FIG. 8, may be used with the planarity measuring apparatus 1406.

The planarity measuring apparatus 1406 of FIGS. 14A–14C is mounted in prober 109 in the orientation shown in FIG. 14B with the exposed ends of push rods 1412 disposed towards the working surface 128 of chuck 126. As discussed above, the chuck 126 is then moved against the exposed ends of push rods 1412, displacing the push rods 1412 as shown in FIG. 14C. As also mentioned above, stop structures or locking mechanisms (not shown in FIGS. 14A–14C) may be used to hold each push rod 1412 in the displaced position. The displacement of each push rod 1412 may be measured by inserting a measuring device in each hole 1420 that measures the distance between the outer surface 1422 of the probe substrate 1410 and the push rod 1412 in each hole 1420. The planarity measuring apparatus 1406 may replace any of the planarity measuring apparatuses (e.g., 306 or 1106) described above and may be used to implement the method of FIG. 9.

Figure 15A:
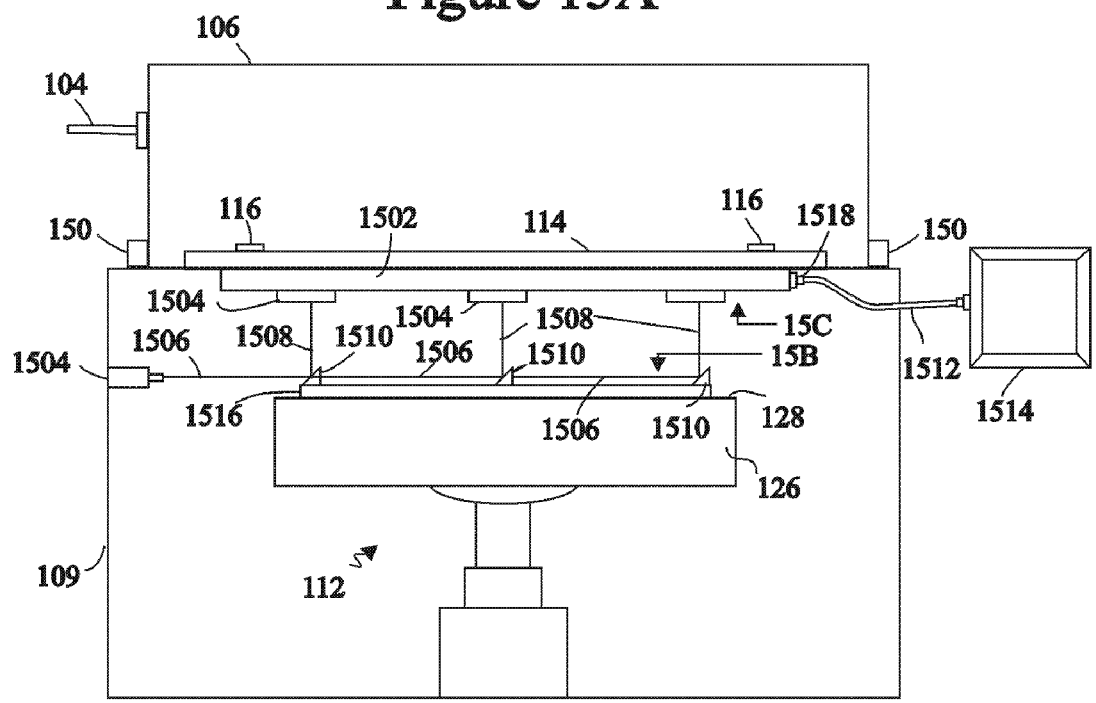
FIG. 15A illustrates another exemplary planarity measuring apparatus disposed in a prober.

FIG. 15A illustrates an exemplary embodiment of a planarity measuring system that may be used to take measurements relating to the orientation of the prober head plate 114 with respect to the working surface 128 of the chuck 126. As will be seen, in FIG. 15A, laser beams 1506 reflected off of reflectors 1510 onto sensors 1504 are used to determine the planar orientation of the prober head plate 114 with respect to the working surface 128 of the chuck 126. (FIG. 15B shows a top view of the reflector substrate 1516, and FIG. 15C shows a bottom view of the sensor substrate 1502.)

Figure 15B:
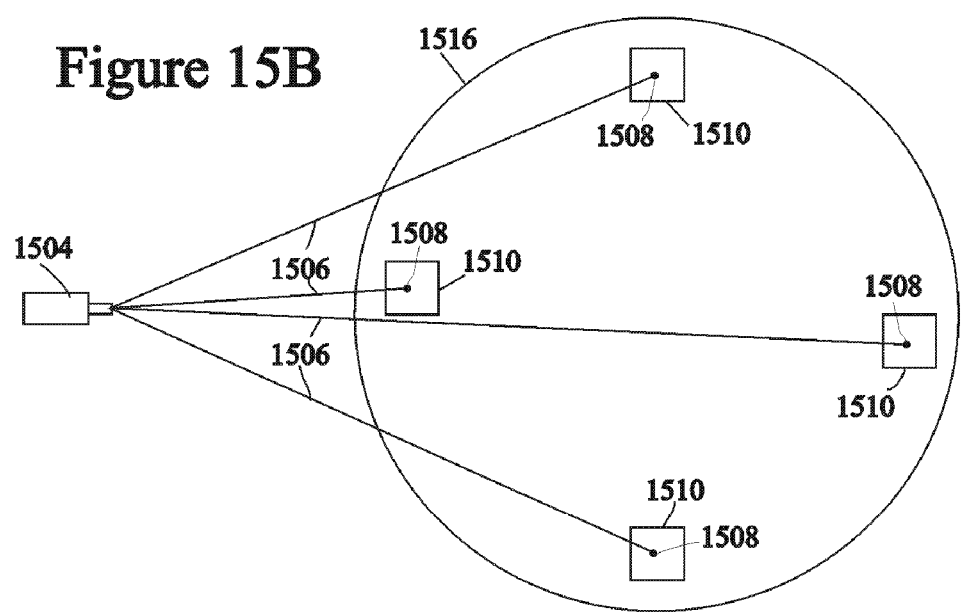
FIG. 15B shows a top view of the reflector substrate in FIG. 15A.
Figure 15C:
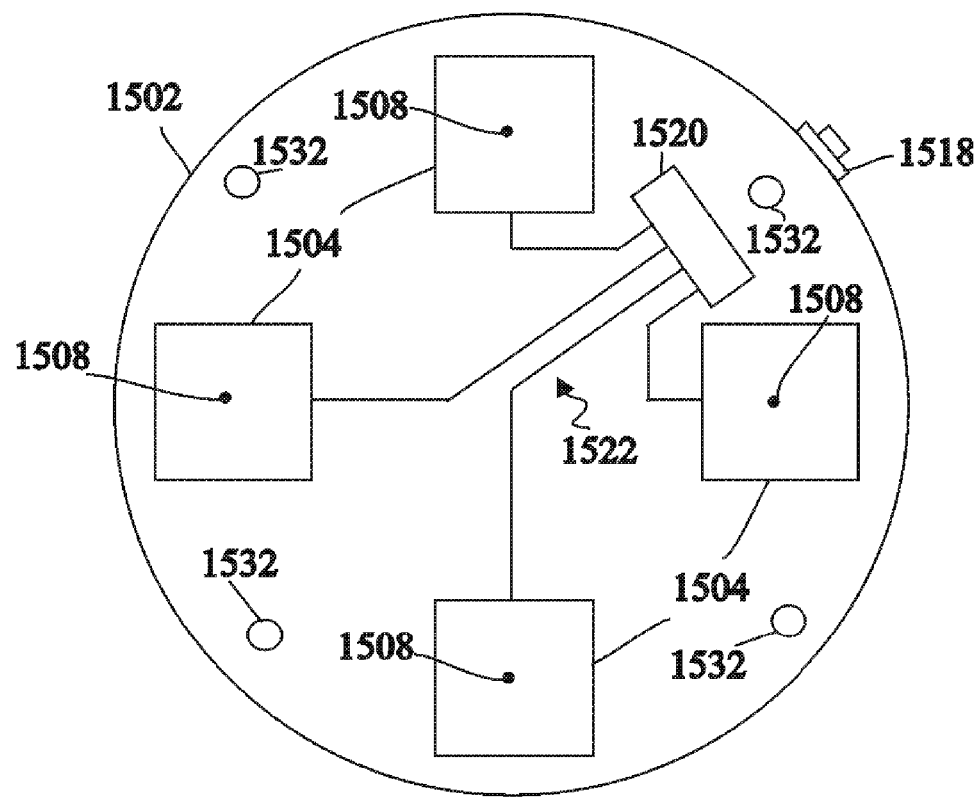
FIG. 15C shows a bottom view of the sensor substrate in FIG. 15A.

In the example shown in FIGS. 15A–15C, a sensor substrate 1502 is attached to the prober head plate 114, and a reflector substrate 1516 is disposed on chuck 126. The reflector substrate 1516 includes a plurality of reflectors 1510 (four are shown in FIGS. 15A and 15B but more or fewer could be used), which reflect laser beams 1506 from laser source 1504 onto sensors 1504 attached to the sensor substrate 1502. (Laser source 1504 may generate multiple beams 1506 or may generate one or more beams that are split into beams 1506.) The sensor substrate 1502, which may be a probe card assembly modified to have sensors 1504 rather than probes, is attached with securing mechanisms 116 through holes 1532 to the prober head plate 114. After being calibrated to determine the locations of reflected beams 1508 (or the relationship among the reflected beams 1508) on sensors 1504 for a known planar orientation of the prober head plate 114 with respect to the working surface 128 of the chuck 126, a prober head plate 114 may be planarized with respect to the working surface 128 of the chuck 126 by monitoring the locations of the reflected beams 1508 on sensors 1504 and adjusting the prober head plate 114 and/or the chuck 126 until the locations of the reflected beams 1508 on sensors 1504 match (to within a desired tolerance) the known planar orientation condition. It should be apparent that, in this example, the orientation of the reflectors 1508 corresponds to the planarity of the chuck surface 128, and the orientation of the sensors 1504 correspond to the planarity of the prober head plate 114. It should also be apparent, therefore, that the locations of the reflected beams 1508 on sensors 1504 correspond to measurements that relate to the planarity of the prober head plate 114 to the chuck surface 128.

In the example shown in FIGS. 15A–15C, and as best seen in FIG. 15C, electrical connections 1522 connect sensors 1504 with a processor (or other electronic circuit) 1520 on sensor substrate 1502. Electrical connection 1518 is electrically connected (not shown) to the processor 1520, and as shown in FIG. 15A, the processor 1520 may be connected through connection 1518 and cable 1512 to a display 1514. The processor 1520 may simply output for display on display 1514 the locations of reflected beams 1508 on sensors 1504. Alternatively, processor or electronic circuit 1520 may analyze input from the sensors 1504 and output for display on display 1514 information indicating the planar orientation of prober head plate 114 with respect to chuck 126 and/or information describing where and how to adjust the prober head plate 114 or the chuck 126 to bring the prober head plate 114 and chuck 126 into planar alignment. As yet another alternative, rather than (or in addition to) driving display 1514, output from the processor 1520 may drive adjustment mechanisms (not shown in FIGS. 15A–15C) like adjustment mechanisms 1020 in FIG. 10 to adjust automatically prober head plate 114 to bring it into planarity with chuck 126.

Figure 16:
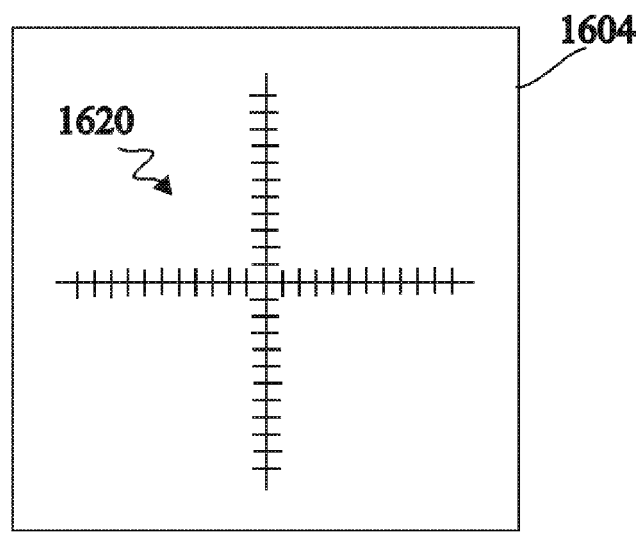
FIG. 16 illustrates an exemplar sensor.

Of course, sensors 1504 need not generate an electric signal corresponding to the location of a laser beam on the sensor or be connected to a processor 1520 or to a display 1514. Rather, sensors 1504 may simply be a target on which a laser beam may be seen by a human operator and thus be configured for a human operator to view and determine the location of a reflected beam 1508 on a sensor 1504. FIG. 16 illustrates such a sensor 1604, which includes a target grid 1620. Sensor 1604 in FIG. 16 may replace sensors 1504 on sensor substrate 1502, and sensors 1604 may be translucent or otherwise configured to allow a human operator to view (e.g., from the top of prober 109) the sensors 1604 to determine the locations of reflected beams 1508 on the sensors. Again, the sensor substrate may be calibrated initially to determine the locations on target grid 1620 of reflected beams 1508 that correspond to a planar orientation of the prober head plate 114 with respect to the chuck 126.

Figure 17A:
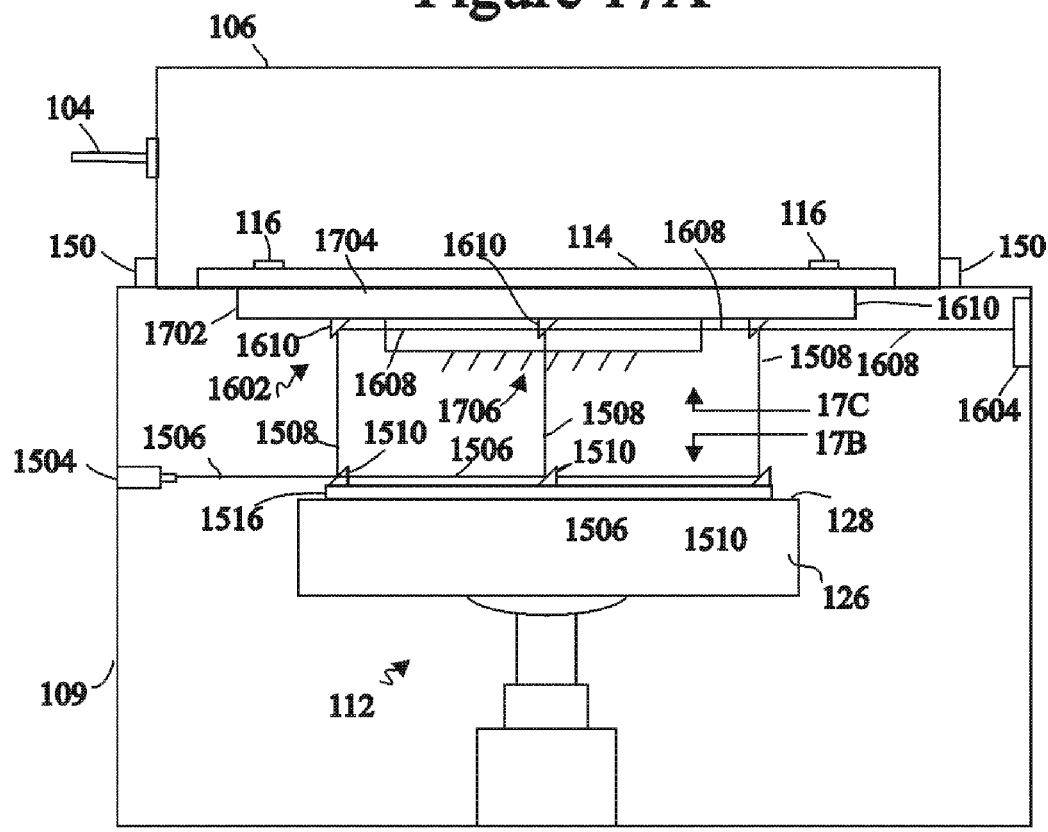
FIG. 17A illustrates yet another exemplary planarity measuring apparatus disposed in a prober.
Figure 17B:
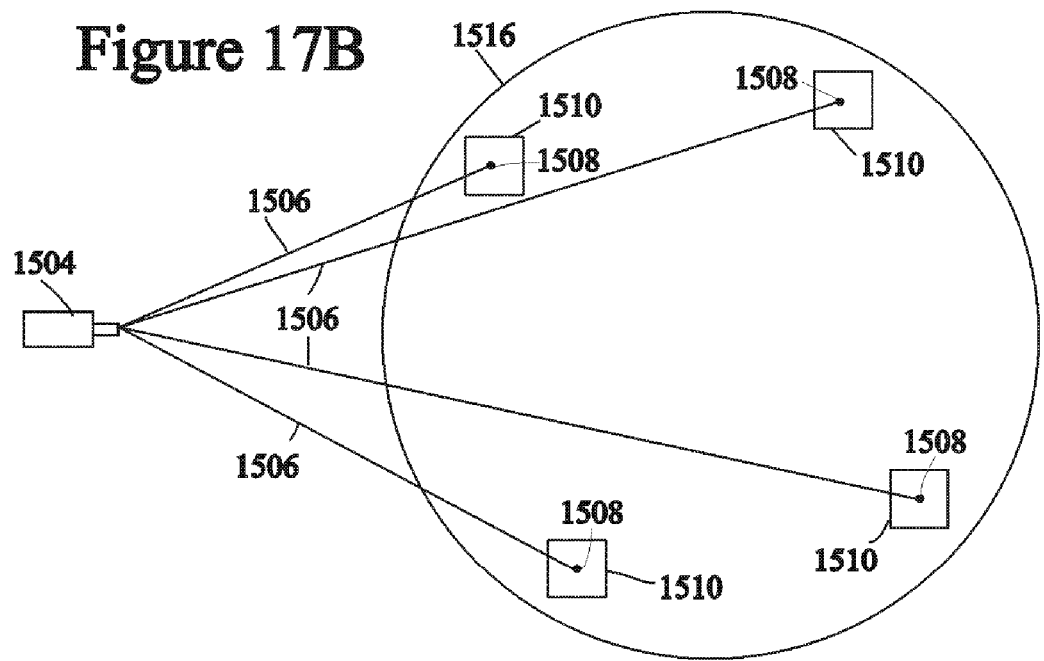
FIG. 17B shows a top view of the reflector substrate in FIG. 17A.
Figure 17C:
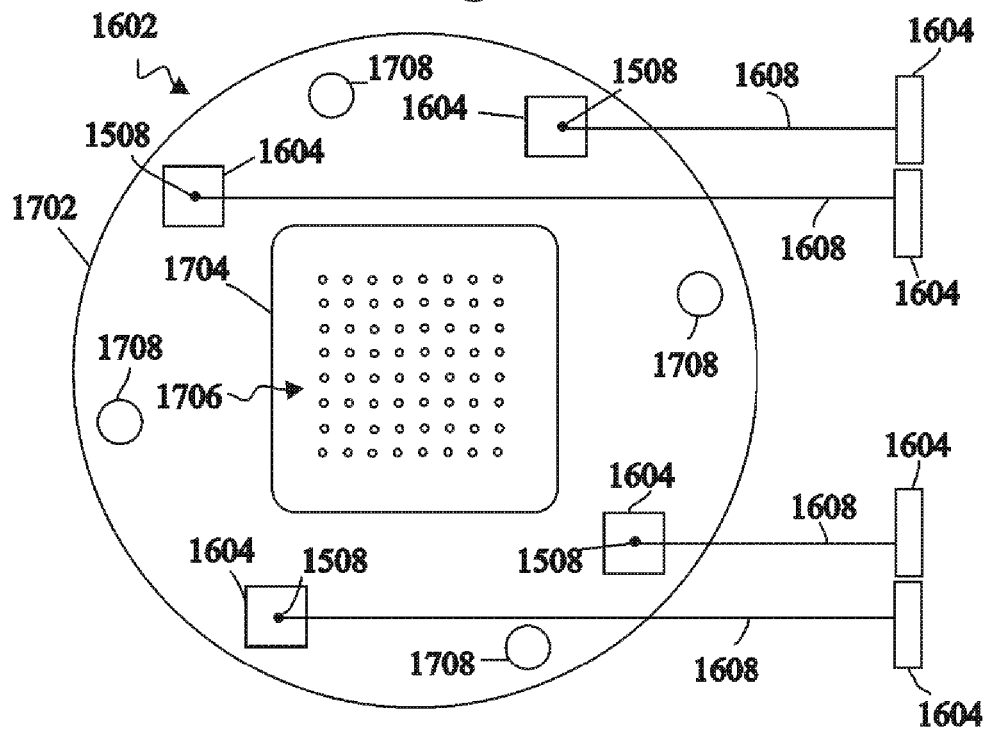
FIG. 17C shows a bottom view of the probe card assembly in FIG. 17A.

The embodiments and variations shown in FIGS. 15A–15C and 16 in which laser beams are used to determine the planarity of a prober head plate 114 with respect to a chuck 126 are exemplary only and many variations are possible. The embodiment shown in FIGS. 17A–17C illustrate two such exemplary variations. First, in the embodiment shown in FIGS. 17A–17C, a probe card assembly 1602 (including a probe board 1702 with holes 1708 for securing mechanism 116, a probe substrate 1704, and a plurality of probes 1706 for contacting a wafer or other electronic device under test) is modified to be also used to planarize the prober head plate 114 with respect to the chuck 126. Thus, in the embodiment shown in FIGS. 17A–17C, the prober head plate 114 may be planarized without removing the probe card assembly and the test head 106. Second, sensors 1604 are disposed on a side wall of prober 109, and reflected beams 1508 are further reflected (as beams 1608) by a second set of reflectors 1610 as shown in FIGS. 17A and 17C.

Using the configuration shown in FIGS. 17A–17C, the planarity of the prober head plate 114 with respect to the chuck 126 may be determined as follows. Laser beams 506 generated by laser source 1504 are directed against reflectors 1510. Reflectors 1510 on reflector substrate 1516 (a top view of which is shown in FIG. 17B) reflect beams 1506 (as reflected beams 1508) onto reflectors 1610 on probe card assembly 1602 (as shown in FIG. 17A). The reflectors 1610 on the probe card assembly 1602 (a bottom view of which is shown in FIG. 17C), in turn, reflect beams 1608 onto sensors 1604, which are disposed on a side of the prober 109 (as shown in FIG. 17A) where they may be viewed by a human operator.

It should be apparent that, in this example, the orientation of the reflectors 1508 corresponds to the planarity of the chuck surface 128, and the orientation of the reflectors 1604 correspond to the planarity of the prober head plate 114. It should also be apparent, therefore, that the locations of the beams 1608 on sensors 1604 correspond to measurements that relate to the planarity of the prober head plate 114 to the chuck surface 128.

Of course, reflectors 1610 on probe card assembly 1602 may be replaced by electronic sensors 1504 (similar to the configuration shown in FIGS. 15A–15C) and connected to a processor or electronic circuit (e.g., like 1520 in FIG. 15C) that drives a display (e.g., like display 1514 in FIG. 15A) or an adjustment mechanism (e.g., like 1020 in FIG. 10).

Figure 18:
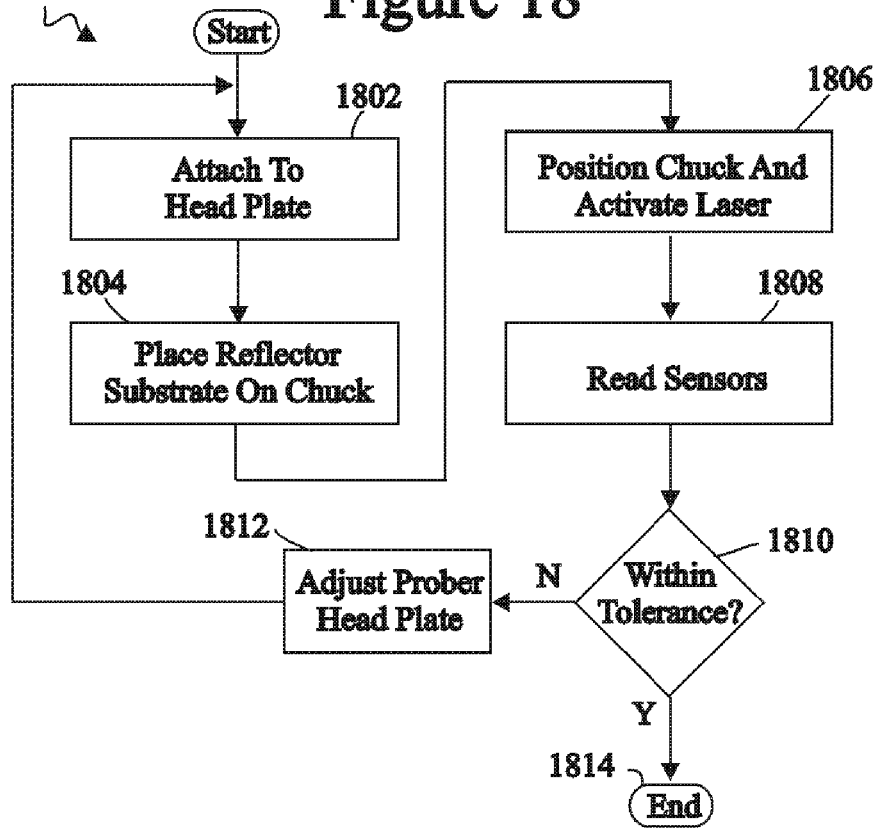
FIG. 18 illustrates an exemplary method for bringing the planarity of the prober head plate to within a specified tolerance of the working surface of the chuck of the prober of FIGS. 15A or 17A.

FIG. 18 illustrates an exemplary method 1800 for verifying and adjusting the prober head plate 114 in FIGS. 15A or 17A with respect to the working surface 128 of chuck 126 in FIGS. 15A or 17A using the planarity measuring system shown in FIGS. 15A–15C or 17A–17C. As shown in FIG. 18, at step 1802, either the sensor substrate 1502 of FIG. 15A or the probe card assembly 1602 of FIG. 17A is attached to the prober head plate 114 (of FIGS. 15A or 17A) by securing mechanism 116. As discussed above with respect to step 901 of FIG. 9, there is no need to remove or even to move the test head 106 (see FIG. 1), which may be left in a "test position." Thus, as shown in FIGS. 15A and 17A, the test head 106 may be left secured to prober 109 in FIGS. 15A and 17A in a "test position." Of course, however, the test head 106 may be removed or moved.

At step 1804, the reflector substrate 1516 is placed on the chuck 126. At step 1806, the chuck 126 moves the reflector substrate 1516 such that reflectors 1510 are aligned with laser beams 1506 as shown in FIGS. 15A or 17A, and the laser source 1504 is activated so that it generates beams 1506 as shown in FIGS. 15B or 17B. As described above, beams 1506 are reflected onto sensors 1504 or 1604. More specifically, in FIGS. 15A–15C, beams 1506 are reflected off of reflectors 1510 on reflector substrate 1516 as reflected beams 1508 onto sensors 1504. In FIGS. 17A–17C, beams 1506 are also reflected off of reflectors 1510 as reflected beams 1508, but reflected beams 1508 are themselves reflected off of reflectors 1610 on probe card assembly 1602 as beams 1608 onto sensors 1604.

At steps 1808 and 1810, the sensors 1504 or 1604 are read to determine, as described above, whether the prober head plate 114 is sufficiently planar with respect to the chuck surface 128. If needed, the method 1800 branches to step 1812, where the planarity of the prober head plate 114 is adjusted. Alternatively or in addition, the planarity of the working surface 128 of the chuck 126 may be adjusted at step 1812. The method 1800 may be repeated as necessary, as shown in FIG. 18.

The method shown in FIG. 18 may be implemented in whole or in part in software operating on the processor 1520 (see FIG. 15C). Likewise, the method shown in FIG. 18 may be implemented as software operating on a controller like controller 1002 in a system 1000 like that shown in FIG. 10 in which push rod controller and sensor 1008 is replaced with a mechanism for controlling laser source 504 and reading sensors 1504.

It should be noted that any of the planarity measuring apparatuses or systems and the planarity adjusting methods described herein may be used in multiple probers to planarize the prober head plates in each such prober.

Various exemplary embodiments and applications of the invention have been presented and described. Many variations and modifications and alternative embodiments and applications are possible. For example, although the embodiments illustrated herein have been described as applicable to a semiconductor wafer probing system, the embodiments may be modified to measure and/or adjust the planarity of any two structures in which one structure is configured to hold a device to be probed and the other structure is configured to hold the device that is to do the probing. That is, any of the exemplary embodiments, measuring apparatuses, and methods described herein may be used to measure the planarity of any first structure (e.g., the prober head plate 114) with respect to any second structure (e.g., the working surface 128 of chuck 126). Indeed, the embodiments may be modified to measure and/or adjust the planarity of any two structures that are movable with respect to each other. As another example, laser beams need not be used in the embodiments shown in FIGS. 15A–15C and 17A–17C, but other forms of directed energy may be used. As yet another example, the multiple sensors 1504 and 1604 shown in FIGS. 15A–17C may be replaced with fewer but larger sensors. For example, the four sensors 1504 shown in FIG. 15C may be replaced by one large sensor disposed to detect each of the reflected laser beams 1508 reflected from reflectors 1510. (That is, the large sensor covers an area on sensor substrate 1502 that includes at least those areas covered by sensors 1504 shown in FIG. 15C.) Sensors 1604 in FIG. 17C may similarly be replaced with one large sensor. As still another example, multiple laser interferometers or similar non-contact distance measuring devices may direct laser or other energy beams at reflectors on a prober chuck and probe card assembly to be returned by reflection along the incident paths of the beam such that variations in distance between the chuck and probe card assembly at various locations can be measured.

What is claimed is:

1. A method for use in a prober, said prober comprising a moveable chuck for holding an electronic device to be tested, a head plate for holding a probe card assembly having probes for contacting said electronic device during testing of said electronic device, and a securing device for securing a test head to said prober in a test position in which said test head provides electrical connections from a tester to said probe card assembly, said method comprising:

obtaining a plurality of measurements relating to a planar orientation of said head plate with respect to said chuck, wherein said obtaining step comprises directing a plurality of beams of light between said chuck and said head plate.

2. The method of claim 1, wherein said obtaining step comprises obtaining said plurality of measurements while said securing device secures said test head to said prober in said test position.

3. The method of claim 1 further comprising determining a planarity of said head plate with respect to said chuck using said measurements.

4. The method of claim 3 further comprising, based on said determining step, adjusting a planarity of said head plate with respect to said chuck.

5. The method of claim 1, wherein said obtaining step is further performed while said probe card assembly is attached to said head plate.

6. The method of claim 1, wherein said directing step comprises directing said beams of light from reflectors disposed on said chuck to sensors attached to a device that is attached to said head plate.

7. The method of claim 1, wherein said directing step comprises directing said beams of light from reflectors disposed on said chuck to sensors disposed on a substrate that is secured to said head plate.

8. The method of claim 7, wherein said substrate comprises said probe card assembly.

9. A method for use in a prober, said prober comprising a moveable chuck for holding an electronic device to be tested, a head plate for holding a probe card assembly having probes for contacting said electronic device during testing of said electronic device, and a securing device for securing a test head to said prober in a test position in which said test head provides electrical connections from a tester to said probe card assembly, said method comprising:

obtaining a plurality of measurements relating to a planar orientation of said head plate with respect to said chuck, wherein said obtaining step comprises directing a plurality of beams of light between a first plurality of light devices disposed to correspond to a planarity of said chuck and a second plurality of light devices disposed to correspond to a planarity of said head plate.

10. The method of claim 9, wherein said first plurality of light devices include reflectors for reflecting said beams of light.

11. The method of claim 10, wherein said second plurality of light devices comprise sensors for sensing positions of said beams of light.

12. An apparatus for use in a prober, said prober comprising a moveable chuck for holding an electronic device to be tested, a head plate for holding a probe card assembly having probes for contacting said electronic device during testing of said electronic device, and a securing device for securing a test head to said prober in a test position in which said test head provides electrical connections from a tester to said probe card assembly, said apparatus comprising:

measuring means for obtaining a plurality of measurements relating to a planar orientation of said head plate with respect to said chuck; and a securing mechanism configured to secure at least a portion of said measuring means to said head plate, wherein said measuring means comprises a plurality of reflectors disposed to reflect light beams between said chuck and said head plate.

13. The apparatus of claim 12 wherein said measuring means obtains said plurality of measurements while said test head is secured to said prober in said test position.

14. The apparatus of claim 12, where said apparatus composes said probe card assembly.

15. The apparatus of claim 12, wherein said reflectors are attached to a substrate configured to be disposed on said chuck.

16. The apparatus of claim 15 further comprising a plurality of sensors configured to sense locations of said beams, wherein said securing mechanism is configured to attach said sensors to said head plate.

17. An apparatus for use in a prober, said prober comprising a moveable chuck for holding an electronic device to be tested, a head plate for holding a probe card assembly having probes for contacting said electronic device during testing of said electronic device, and a securing device for securing a test head to said prober in a test position in which said test head provides electrical connections from a tester to said probe card assembly, said apparatus comprising:

measuring means for obtaining a plurality of measurements relating to a planar orientation of said head plate with respect to said chuck; and a securing mechanism configured to secure at least a portion of said measuring means to said head plate;

wherein:
said measuring means comprises a substrate and a plurality of moveable elements moveably attached to said substrate, said securing mechanism is configured to secure said substrate to said head plate, and while said substrate is secured to said head plate, said moveable elements are moveable from a first position in which said moveable elements correspond to a planarity of said head plate into a second position in which said moveable elements correspond to a planarity of said chuck;

said method further comprising holding means for allowing said moveable elements to move from said first position to said second position and then holding said moveable elements in said second position, wherein said holding means comprises an adjustable screw.

18. The apparatus of claim 17, wherein said screw comprises a nylon tip.

19. An apparatus for use in a prober, said prober comprising a moveable chuck for holding an electronic device to be tested, a head plate for holding a probe card assembly having probes for contacting said electronic device during testing of said electronic device, and a securing device for securing a test head to said prober in a test position in which said test head provides electrical connections from a tester to said probe card assembly, said apparatus comprising:

measuring means for obtaining a plurality of measurements relating to a planar orientation of said head plate with respect to said chuck; and a securing mechanism configured to secure at least a portion of said measuring means to said head plate, wherein said measuring means comprises:
a first plurality of light devices disposed to correspond to a planarity of said chuck; and a second plurality of light devices disposed to correspond to a planarity of said head plate.

20. The apparatus of claim 19, wherein said first plurality of light devices include reflectors for reflecting beams of light.

21. The apparatus of claim 20, wherein said second plurality of light devices comprise sensors for sensing positions of said beams of light reflected by said reflectors.

22. The apparatus of claim 19, wherein said second plurality of light devices are attached to said probe card assembly, and said probe card assembly is secured to said head plate by said securing mechanism.

23. A prober for use in testing an electronic device, said prober comprising:

a moveable chuck disposed to hold said electronic device during testing of said electronic device;

a head plate configured to hold a probe card assembly having probes for contacting said electronic device during testing of said electronic device;

a test head attachable to said prober in a test position in which said test head provides electrical connections from a tester to said probe card assembly during testing of said electronic device; and a structure configured to obtain a plurality of measurements relating to a planar orientation of said head plate with respect to said chuck, wherein said structure comprises:

a first plurality of light devices disposed to correspond to a planarity of said chuck; and a second plurality of light devices disposed to correspond to a planarity of said head plate.

24. The prober of claim 23, wherein said structure is further configured to obtain said plurality of measurements while said test head is attached to said prober in said test position.

25. The prober of claim 23, wherein said first plurality of light devices include reflectors for reflecting beams of light.

26. The prober of claim 25, wherein said second plurality of light devices comprise sensors for sensing positions of said beams of light reflected by said reflectors.

27. The prober of claim 26, wherein said second plurality of light devices are attached to said probe card assembly, and said probe card assembly is secured to said head plate.

* * * * *